United States Patent
Miyauchi et al.

(10) Patent No.: US 6,826,722 B2
(45) Date of Patent: Nov. 30, 2004

(54) METHOD AND APPARATUS FOR REPRODUCING DATA AND METHOD AND APPARATUS FOR RECORDING AND/OR REPRODUCING DATA

(75) Inventors: Toshiyuki Miyauchi, Tokyo (JP); Masayuki Hattori, Kanagawa (JP); Jun Murayama, Tokyo (JP)

(73) Assignee: Sony Corporation, Tokyo (JP)

( * ) Notice: Subject to any disclaimer, the term of this patent is extended or adjusted under 35 U.S.C. 154(b) by 777 days.

(21) Appl. No.: 09/814,280

(22) Filed: Mar. 21, 2001

(65) Prior Publication Data

US 2001/0052098 A1 Dec. 13, 2001

(30) Foreign Application Priority Data

Mar. 23, 2000 (JP) ........................................ 2000-087129

(51) Int. Cl.[7] .......................... G06F 11/00; H03M 13/00
(52) U.S. Cl. ....................................... 714/752; 714/752
(58) Field of Search ................................ 714/701, 702, 714/746, 752, 755, 762; 711/127, 157

(56) References Cited

PUBLICATIONS

T. Souvignier, A. Friedmann, M. Oberg, P.H. Stegel, R.E. Swanson. J.K. Wolf: "Turbo Decoding for PR4: Parallel Versus Serial Concatenation" IEEE International Conference on Communications, vol. 3, Jun. 6–10, 1999, pp. 1638–1642, XP002170541 New York.

S. Benedetto, D. Divsalar, G. Montorsi, F. Pollara: "Analysis, Design and Iterative Decoding of Double Serially Concatenated Codes with Interleavers" IEEE Journal on Selected Areas in Communications, vol. 16, No. 2, Feb. 1998, pp. 231–244, XP000741777.

S. Benedetto, D. Divsalar, G. Montorsi, F. Pollara: "Serial Concatenation of Interleaved Codes: Performance Analysis, Design, and Iterative Decoding" TDA Progress Report, vol. 42–126, Aug. 15, 1996, pp. 1–26, XP002163216.

S. Benedetto, G. Montorsi, D. Divsalar, F. Pollara: "Soft–Input Soft–Output Modules for the Construction and Distributed Iterative Decoding of Code Networks" European Transactions on Telecommunications, vol. 9, No. 2, Mar. 1998, pp. 155–172, XP000751912 Milano, IT.

R.D. Cideciyan et al.: "A PRML System for Digital Magnetic Recording" IEEE Journal on Selected Areas of Communications, vol. 10, No. 1, Jan. 1992, pp. 38–56, XP000457625 New York.

J. Petersen: "Implementierungsaspekte zur Symbol–by–Symbol MAP–Decodierung von Faltungscodes" Itg Fachberichte, vol. 130, No. 1, Jan. 1, 1994, pp. 41–48, XP000503776 Berlin.

R.T. Lynch: "Channels and Codes for Magnetooptical Recording" IEEE Journal on Selected Areas in Communications, vol. 10, No. 1, Jan. 1992, pp. 57–72, XP000462065 New York.

*Primary Examiner*—Christine T. Tu
(74) *Attorney, Agent, or Firm*—Frommer Lawrence & Haug LLP; William S. Frommer

(57) ABSTRACT

A magnetic recording and/or reproducing apparatus in which the decoding error rate is to be lowered through realization of the high-performance encoding and the high efficiently decoding. To this end, a magnetic recording and/or reproducing apparatus 50 includes, in its recording system, an error correction coder 51 for error correction encoding input data, an interleaver 52 for interleaving data supplied from the error correction coder 51 for re-arraying the data sequence, a modulation encoder 53 for modulation encoding the data from the interleaver 52 in a predetermined fashion and an interleaver 54 for interleaving the data from the modulation encoder 53 for re-arraying the data sequence. The magnetic recording and/or reproducing apparatus 50 also includes, in its reproduction system, a channel, modulation and error correction turbo decoder 64 formed by concatenation of an error correction soft decoder and a modulation decoder for decoding the input data with the interposition of two deinterleavers and two interleavers.

92 Claims, 12 Drawing Sheets

METHOD AND APPARATUS FOR REPRODUCING DATA AND METHOD AND APPARATUS FOR RECORDING AND/OR REPRODUCING DATA

BACKGROUND OF THE INVENTION

1. Field of the Invention

This invention relates to a method and apparatus for recording data on a recording medium, a method and apparatus for reproducing data recorded on a recording medium and a method and apparatus for recording and/or reproducing data for a recording medium.

2. Description of Related Art

As a recording medium for recording digital data, there are known a wide variety of recording mediums of the magnetic, optical or photomagnetic system, such as a hard disc, a so-called DVCR (digital video cassette recorder) or a so-called CD (Compact Disc), DVD (digital versatile disc) and a so-called MO (magneto-optical disc).

For recording signals on these recording mediums, physical processing needs to be executed on the recording mediums, such as by controlling the direction of magnetization by a write head for a recording medium of the magnetic recording system, or by forming pits of lengths corresponding to signals by a stamper for a recording medium of the optical recording system. In this case, in order to permit the amplitude control of readout signals or clock reproduction on the reproducing side reading out the signals recorded on the recording medium to operate as normally, the signal recording side for recording signals on a recording medium routinely uses a system of modulation-encoding the signal in a pre-set manner to record the resulting modulation-coded signal.

A modulation coder, performing this modulation coding, is routinely fed with binary signals exempt from various limitations, and outputs binary signals free of various limitations. These limitations on the signals include DC free limitations which state that the numbers of "0"s and "1"s be equalized over a sufficient long length of the concatenations of "0"s and "1"s, and the (d, k) limitations which state that the minimum and maximum numbers of consecutive "0"s and "1"s in a code be d and k, respectively. FIG. 1 shows an input/output example in a modulation coder outputting a code satisfying the (d, k)=(2, 7) limitations. Specifically, a modulation coder 150, outputting a code satisfying the (d, k)=(2, 7) limitation, is shown in FIG. 1, by way of concrete explanation of the concept of the (d, k) limitations. That is, if an input signal, free of the limitation, is input to the modulation coder 150, outputting a code satisfying the (d, k)=(2, 7) limitation, modulation-encodes the input signal to generate and output an output signal in which the minimum and maximum numbers of consecutive "0"s are 2 and 7, respectively.

The above example indicates that, in converting a bit string free of a limitation is converted into another bit string subjected to a limitation, the total number of the output bits is larger than that of the input bits. If the total number of input bits is K and the total number of output bits is N, the ratio K/N is represented as a code rate R. This code rate R serves as an index indicating the efficiency of the modulation coding. If two or more modulation coders, generating output signals satisfying the same limitations, are compared to one another, a modulation coder having the high code rate R is able to encode more input bits for a given number of output bits than one having the low code rate R. Stated differently, a modulation coder having a high code rate R is able to record more information on a pre-set recording medium than one having a low code rate R.

The modulation coding may be classified into a block coding system in which input bits are divided into plural blocks of pre-set lengths and output bits generated are divided into plural blocks of pre-set lengths corresponding to the blocks of the input bits, and a variable length coding system, in which encoding units of input bits and output bits associated with the input bits are varied. For example, the so-called 8/9 code or the 16/17 code, routinely used for modulation coding, belong to the block coding system, whilst the so-called (1, 7) RLL code or the (2, 7) RLL code belong to the variable length encoding system.

For example, in a block modulation encoding system, fed with two bits as input bits, and generating three output bits satisfying the (d, k)=(0, 2) limitations, a modulation coder has a conversion table as Table 1:

TABLE 1

Example of Conversion Table

| input bits | output bits |
|---|---|
| 00 | 011 |
| 01 | 101 |
| 10 | 111 |
| 11 | 110 | stored in e.g., a memory, not shown. The modulation coder references this conversion table and finds, for each 2-bit input, an associated 3-bit output, with the output bits being output sequentially.

On the other hand, a modulation decoder for modulating-decoding the modulation-coded signals has a back-conversion table, as Table 2:

TABLE 2

Example of Back-Conversion Table

| input bit | decoded bits |
|---|---|
| 000 | 01 |
| 001 | 00 |
| 010 | 10 |
| 011 | 00 |
| 100 | 11 |
| 101 | 01 |
| 110 | 11 |
| 111 | 10 | corresponding to the conversion table of Table 1, stored in e.g., a memory, not shown. The modulation decoder references this back-conversion table to find and sequentially output 2 decoded bits, associated with the 3 input bits.

FIG. 2 shows a typical modulation decoder 160 having at least a ROM (read-only memory) 161. The modulation decoder 160 is fed with an input address signal D161 to output the contents stored in an address of the ROM 161 corresponding to this input address signal D161 as a demodulated decoded signal D162. In actuality, if the input bits are back-converted into decoded bits in accordance with the back-conversion table shown in Table 2, the contents of the decoded bits are stored in addresses of a ROM 161 of the modulation decoder 160, corresponding to the input bits in Table 2. The decoded bits, stored in these addresses, are read out by way of performing the back-conversion.

FIG. 3 shows a typical modulation decoder 170 at least having a combination circuit 171. The modulation decoder 170 is fed with an input signal D171 and executes logical operations on the input signal D171 by the combination circuit 171 to generate a modulated decoded signal D172. In actuality, if, in performing back conversion from the input bits to the decoded bits in accordance with the back-conversion table of Table 2, the three-bit input signal D171 is represented as ($a_0$, $a_1$, $a_2$) and a two-bit modulated decoded signal D172 is represented as ($b_0$, $b_1$), the modulation decoder 170 generates the output bits ($b_0$, $b_1$) by the combination circuit 171 corresponding to the following logical equations (1):

$$b_0 = (a_1 \& a_2) | (a_0 \& !a_1 \& !a_2) | (!a_0 \& a_1 \& !a_2)$$

$$b_1 = (a_0 \& !a_1) | (!a_0 \& !a_1 \& !a_2) | (a_0 \& a_1 \& !a_2) \quad (1)$$

where |, & and ! indicate the logical sum, logical product and logical negation, respectively.

If the modulation coder and the modulation decoder are applied to a magnetic recording and/or reproducing apparatus for recording and/or reproducing data on or from a recording medium in accordance with the magnetic recording system, the recording and/or reproducing apparatus is configured as shown in FIG. 4.

That is, the magnetic recording and/or reproducing apparatus 200, shown in FIG. 4, includes, as a recording system for recording data on a recording medium 250, an error correction encoder 201 for error correction encoding input data, a modulation encoder 202, for modulation encoding the input data, a precoder 203 for filtering input data for compensating its channel characteristics, a write current driver 204 for converting respective bits of the input data into write current values, and a write head 205 for recording data on the recording medium 250. The magnetic recording and/or reproducing apparatus 200 also includes, as a playback system for reproducing data recorded on the recording medium 250, a readout head 206 for reading out data recording on the recording medium 250, an equalizer 207 for equalizing the input data, a gain adjustment circuit 208 for adjusting the gain of the input data, an analog/digital converter (A/D converter) 209 for converting analog data into digital data, a timing generating circuit 210 for generating clocks, a gain adjustment control circuit 211 for controlling the gain adjustment circuit 208, a viterbi decoder 212 for viterbi-decoding the input data, a modulation decoder 213 for modulation decoding the input data and an error correction decoder 214 for error correction decoding the input data.

In recording data on the recording medium 250, the magnetic recording and/or reproducing apparatus 200 performs the following operations:

When fed with the input data D201, the magnetic recording and/or reproducing apparatus 200 applies error correction coding to the input data D201, by the error correction encoder 201, to generate error corrected encoded data D202.

The magnetic recording and/or reproducing apparatus 200 modulation encodes the error corrected encoded data D202 from the error correction encoder 201, by the modulation encoder 202, to generate modulation-encoded data D203, which is a string of bits subjected to limitations.

The magnetic recording and/or reproducing apparatus 200 performs filtering on the modulation-encoded data D203, supplied from the modulation encoder 202, by the precoder 203, in such a manner as to compensate for the channel characteristics as from the writing of data on the recording medium 250 up to outputting thereof at an equalizer 207 in the reproducing system, to generate a precode signal D204. For example, if the channel has 1-D characteristics, the precoder 203 performs the filtering F indicated by the following equation (2):

$$F = 1/(1 \oplus D) \quad (2)$$

where $\oplus$ denotes exclusive-OR.

The magnetic recording and/or reproducing apparatus 200 then converts respective bits of the precode signal D204, as binary signal supplied from the precoder 203, by a write current driver 204, into write current values Is, such as by $0 \rightarrow -I_S$, $1 \rightarrow +I_S$, to generate a write current signal D205.

By the write head 205, the magnetic recording and/or reproducing apparatus 200 applies a magnetic write signal D206, corresponding to the write current signal D205 supplied from the write current driver 204, to the recording medium 250.

By the above processing, the magnetic recording and/or reproducing apparatus 200 is able to record data on the recording medium 250.

In reproducing the data recorded on the recording medium 250, the magnetic recording and/or reproducing apparatus 200 performs the following processing:

First, the magnetic recording and/or reproducing apparatus 200 reads out the readout magnetization signal D207 from the recording medium 250 by the readout head 206 to generate a readout current signal D208 conforming to this readout magnetization signal D207.

The magnetic recording and/or reproducing apparatus 200 then equalizes the readout current signal D208, supplied from the readout head 206, by the equalizer 207, so that the channel response since data writing on the recording medium 250 in the recording system until outputting thereof at the equalizer 207 will be of pre-set characteristics, such as 1-D, to generate an equalized signal D209.

The magnetic recording and/or reproducing apparatus 200 then adjusts the gain of the equalized signal D209, supplied from the equalizer 207, by the gain adjustment circuit 208, based on a gain adjustment control signal D213 from the gain adjustment control circuit 211, to generate a gain adjustment signal D210. Meanwhile, the gain adjustment control signal D213 is generated by the gain adjustment control circuit 211, based on the digital channel signal D211, as later explained. Specifically, the gain adjustment control signal D213 is a control signal for maintaining the amplitude of the equalization signal D209 at an expected value.

By the A/D converter 209, the magnetic recording and/or reproducing apparatus 200 digitizes the gain adjustment signal D210, supplied from the gain adjustment circuit 208, to generate the digital channel signal D211. Meanwhile, the A/D converter 209 performs sampling based on the clock signal D212 generated and supplied by the timing generating circuit 210. The timing generating circuit 210, fed with the digital channel signal D211, generates clocks to produce clock signals D212 which are output to the A/D converter 209.

The magnetic recording and/or reproducing apparatus 200 feeds the digital channel signal D211, supplied from the A/D converter 209, to the viterbi decoder 212, which then performs viterbi decoding on the channel response from the upstream side of the precoder 203 in the recording system up to the outputting at the equalizer 207 in the reproducing system, for example, the channel response $R_{ch}$ represented by the following equation (3):

$$R_{ch} = (1-D)/(1 \oplus D) \quad (3)$$

where $\oplus$ denotes Exclusive-OR, to generate a viterbi decoded signal D214.

The magnetic recording and/or reproducing apparatus 200 then applies modulation decoding on the viterbi decoded signal D214, supplied from the modulation decoder 213, to realize data correspondence reversed from that in the modulation encoder 202 in the recording system to generate a modulated decoded signal D215 which is an original input data string not subjected to limitations.

The magnetic recording and/or reproducing apparatus 200 decodes the error correction codes of the modulated decoded signal D215, supplied from the modulation decoder 213, by the error correction decoder 214, to generate output data D216.

By the above processing, the magnetic recording and/or reproducing apparatus 200 is able to reproduce the data recorded on the recording medium 250.

Meanwhile, in the above-described conventional magnetic recording and/or reproducing apparatus 200, the modulation decoder 213 has no more than the function of realizing the correspondence between binary signals reversed from that obtained on modulation encoding by the modulation encoder 202, while the signals in both the input and the output of the modulation decoder 213 need to be binary signals, with the result that the signals on the downstream side of the viterbi decoder 212 are all binary signals.

In other words, it is necessary in the magnetic recording and/or reproducing apparatus 200 to generate binary signals on the upstream side of the modulation decoder 213 and to process the binary signals even on the downstream side of the modulation decoder 213.

Thus, in the magnetic recording and/or reproducing apparatus 200, in which bi-level binary signals need to be used, the information volume in the signal is diminished intentionally with the result that efficient decoding cannot be realized to deteriorate the decoding error rate.

SUMMARY OF THE INVENTION

It is therefore an object of the present invention to provide a method and apparatus for recording data in which high performance encoding may be carried out to permit the reproducing system to perform a highly efficient decoding operation to lower the decoding error rate significantly.

It is another object of the present invention to provide a data reproducing method and apparatus in which efficient decoding may be realized to lower the decoding error rate.

It is yet another object of the present invention to provide a data recording and/or reproducing method and apparatus in which high performance encoding and high efficiency decoding may be realized to lower the decoding error rate.

In one aspect, the present invention provides a data recording apparatus for recording data on a recording medium, including error correction encoding means for error correction encoding input data, first interleaving means for interleaving the data supplied from the error correction encoding means for re-arraying the sequence thereof, modulation encoding means for applying predetermined modulation encoding on the data supplied from the first interleaving means, and second interleaving means for interleaving the data supplied from the modulation encoding means for re-arraying the sequence thereof.

In such data recording apparatus, according to the present invention, the data supplied from the error correction encoding means is interleaved by the first interleaving means to re-array the data sequence, whilst the data supplied from the modulation encoding means is interleaved by the second interleaving means to re-array the data sequence, thereby realizing high performance encoding.

In another aspect, the present invention provides a data recording method for recording data on a recording medium, including an error correction encoding step of error correction encoding input data, a first interleaving step of interleaving the data supplied from the error correction encoding step for re-arraying the sequence thereof, a modulation encoding step of applying predetermined modulation encoding on the data supplied from the first interleaving step and a second interleaving step of interleaving the data supplied from the modulation encoding step for re-arraying the sequence thereof.

In such data recording method, according to the present invention, the data supplied from the error correction encoding step is interleaved in the first interleaving step to re-array the data sequence, whilst the data supplied from the modulation encoding step is interleaved by the second interleaving step to re-array the data sequence, thereby realizing high performance encoding.

In still another aspect, the present invention provides a data reproducing apparatus for reproducing data recorded by a recording equipment for recording data on a recording medium including error correction encoding means for error correction encoding input data, first interleaving means for interleaving the data supplied from the error correction encoding means for re-arraying the sequence thereof, modulation encoding means for applying predetermined modulation encoding on the data supplied from the first interleaving means and second interleaving means for interleaving the data supplied from the modulation encoding means for re-arraying the sequence thereof, in which the data reproducing apparatus includes first deinterleaving means for interleaving input data for re-arraying the sequence thereof, in order to restore a bit sequence of data re-arrayed by the second interleaving means to a bit sequence of data encoded by the modulation encoding means, modulation decoding means for modulation decoding data supplied from the first interleaving means, third interleaving means for interleaving data given as a difference between data output from the modulation decoding means and data output from the first deinterleaving means, based on the same interleaving position information as that for the second interleaving means, second deinterleaving means for interleaving the input data for re-arraying the sequence thereof, in order to restore a bit sequence of data re-arrayed by the first interleaving means to a bit sequence of data encoded by the error correction encoding means, error correction decoding means for decoding the error correction code of data supplied from the second deinterleaving means and fourth interleaving means for interleaving data given by a difference between data output from the error correction decoding means and data output from the second deinterleaving means, based on the same interleaving position information as that for the first interleaving means, for re-arraying the sequence thereof.

In such data reproducing apparatus, according to the present invention, the data interleaved by the first deinterleaving means is decoded by the modulation decoding means, the data given as the difference between the data output from the modulation decoding means and the data output from the first deinterleaving means is interleaved by the third interleaving means to re-array the data sequence, the data interleaved by the second deinterleaving means is decoded by the error correction decoding means and the data given by the difference between the data output from the error correction decoding means and the data output from the second deinterleaving means is interleaved by the fourth interleaving means to re-array the data sequence. Thus, highly efficient decoding may be realized for the entire decoding processing by exploiting the soft information thereby significantly lowering the decoding error rate.

In still another aspect, the present invention provides a data reproducing method for reproducing data recorded by a recording method for recording data on a recording medium including an error correction encoding step of error correction encoding input data, a first interleaving step of interleaving the data supplied from the error correction encoding step of re-arraying the sequence thereof, a modulation encoding step of applying predetermined modulation encoding on the data supplied from the first interleaving step and a second interleaving step of interleaving the data supplied from the modulation encoding step of re-arraying the sequence thereof, in which the data reproducing method includes a first deinterleaving step of interleaving input data for re-arraying the sequence thereof, in order to restore a bit sequence of data re-arrayed by the second interleaving step to a bit sequence of data encoded by the modulation encoding step, a modulation decoding step of modulation decoding data supplied from the first interleaving step, a third interleaving step of interleaving data given as a difference between data output from the modulation decoding step and data output from the first deinterleaving step, based on the same interleaving position information as that for the second interleaving step, a second deinterleaving step of interleaving the input data for re-arraying the sequence thereof, in order to restore a bit sequence of data re-arrayed by the first interleaving step to a bit sequence of data encoded by the error correction encoding step, an error correction decoding step of decoding the error correction code of data supplied from the second deinterleaving step and a fourth interleaving step of interleaving data given by a difference between data output from the error correction decoding step and data output from the second deinterleaving step, based on the same interleaving position information as that for the first interleaving step, for re-arraying the sequence thereof.

In such data reproducing method, according to the present invention, the data deinterleaved by the first deinterleaving step is decoded by the modulation decoding step, the data given as the difference between the data output from the modulation decoding step and the data output from the first deinterleaving step is interleaved by the third interleaving step to re-array the data sequence, the data interleaved by the second deinterleaving step is decoded by the error correction decoding means and the data given by the difference between the data output from the error correction decoding means and the data output from the second deinterleaving step is interleaved by the fourth interleaving step to re-array the data sequence. Thus, highly efficient decoding may be realized for the entire decoding processing by exploiting the soft information thereby significantly lowering the decoding error rate.

DESCRIPTION OF THE PREFERRED EMBODIMENTS

Figure 1:
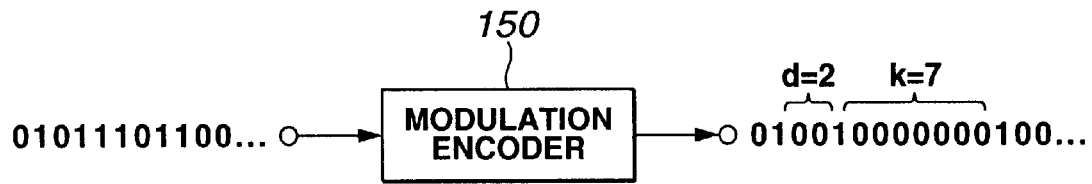
FIG. 1 illustrates an input/output example of a conventional modulation encoder.
Figure 2:
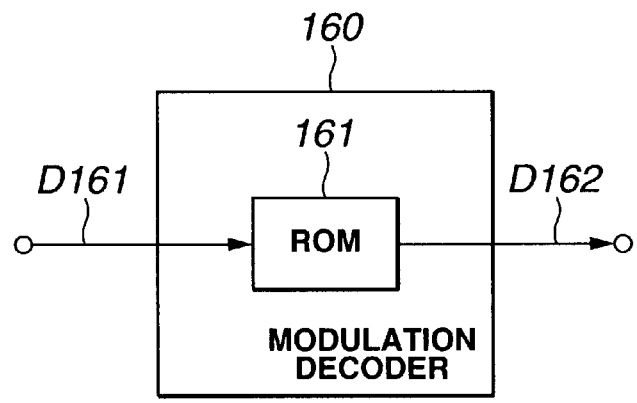
FIG. 2 is a block diagram showing the structure of a conventional modulation decoder.
Figure 3:
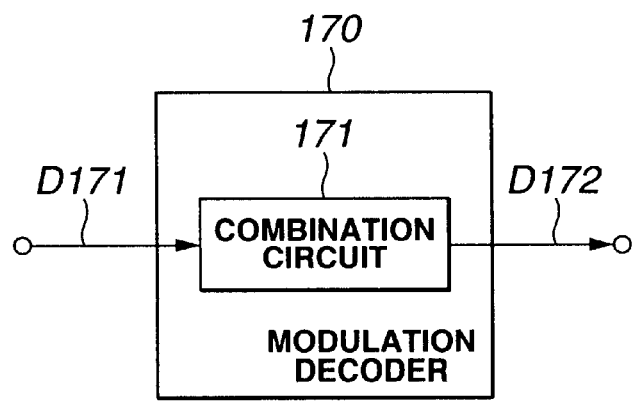
FIG. 3 is a block diagram showing the structure of another conventional modulation decoder.
Figure 4:
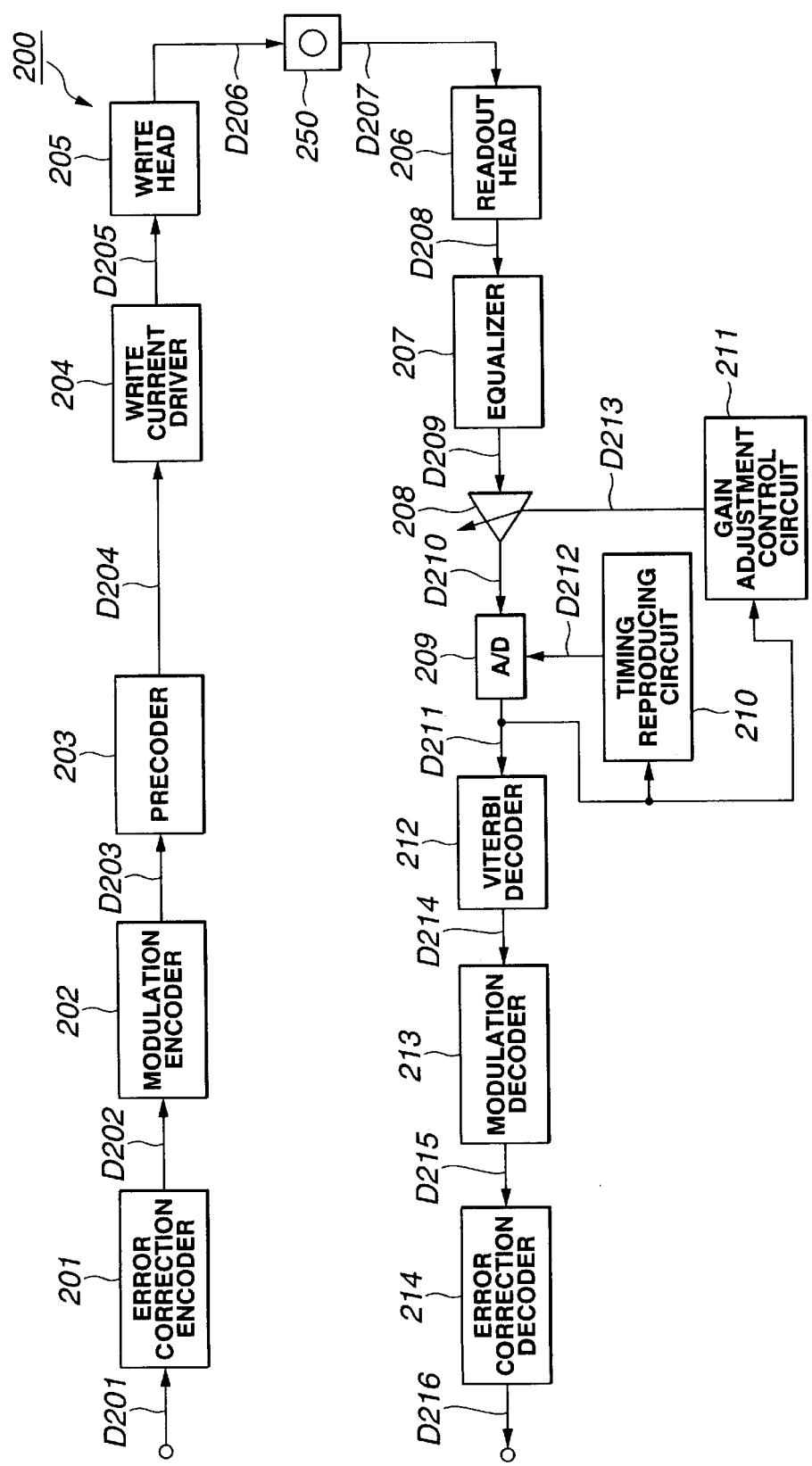
FIG. 4 is a block diagram showing the structure of a conventional magnetic recording and/or reproducing apparatus.

Referring to the drawings, preferred embodiments of the present invention will be explained in detail.

The present embodiment is directed to a magnetic recording and/or reproducing apparatus made up of a recording system for recording data on a recording medium of the magnetic recording system, such as a hard disc or a so-called DVCR (digital video cassette recorder), and a reproducing system for reproducing data recorded on these recording mediums.

This magnetic recording and/or reproducing apparatus includes, in its recording system, an interleaver downstream of a error correction encoder for error correction encoding input data, and another interleaver downstream of a signal modulation encoder, and executes encoding by so-called serial concatenated coding between the error correction encoder, signal modulation encoder and a precoder adapted for performing filtering on signals in such a manner as to compensate for channel characteristics. Moreover, the magnetic recording and/or reproducing apparatus uses, on the reproducing side, a decoder fed with data as a soft input and issuing data as a soft output, that is a soft input soft output (SISO) decoder, as a decoder for the channel, a decoder for modulation decoding the modulation encoded signal and as a decoder for error correction decoding the input data, in order to cause so-called turbo decoding, that is iterative decoding, to occur among these three decoders. That is, the magnetic recording and/or reproducing apparatus applies the encoding by the serial concatenated coding and turbo decoding, known as the encoding method and decoding method giving the performance close to the Shannon limit as set by what is called the Shannon's theorem on the channel coding, to a recording and/or reproducing system performing data recording and/or reproduction for a recording medium.

First, the magnetic recording and/or reproducing apparatus as a first embodiment is explained. Here, the interleaver, applied to the recording system of this magnetic recording and/or reproducing apparatus, is explained by referring to FIGS. 5 to 8.

Figure 5:
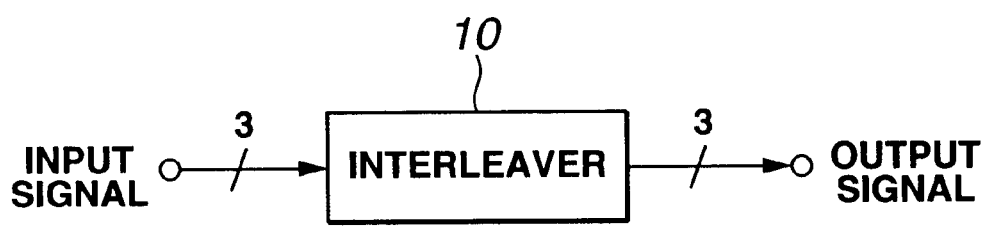
FIG. 5 illustrates an input/output example in an interleaver applied to a recording system of a magnetic recording and/or reproducing apparatus shown as a first embodiment of the present invention for applying bit-based interleaving.
Figure 6:
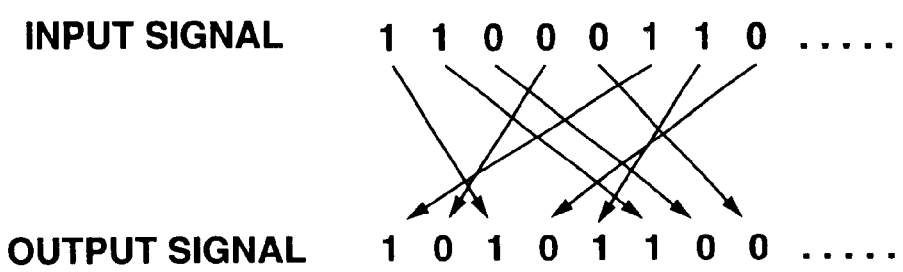
FIG. 6 illustrates the operation of an interleaver used in a recording system of the magnetic recording and/or reproducing apparatus shown in FIG. 5 for applying bit-based interleaving.
Figure 7:
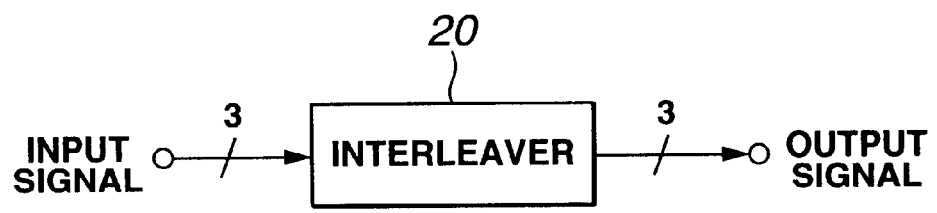
FIG. 7 illustrates an input/output example in a decoder applied to a reproducing system of the magnetic recording and/or reproducing apparatus shown in FIG. 5 for applying modulation encoding block based interleaving.

An interleaver 10, shown in FIG. 5, interleaves data, encoded by error correction encoder provided on a pre-stage of the interleaver 10, on the bit basis, to re-array the bits making up the data. For example, the interleaver 10 re-arrays an input signal on the bit basis, as shown in FIG. 6, to generate an output signal.

Specifically, the interleaver 10 holds the interleaving position information of data, as determined based e.g., on generated random numbers, in e.g., a ROM (read-only memory), not shown, and re-arrays the input signal on the bit basis in accordance with this interleaving position information. For example, the interleaver 10 sequentially holds respective bits, making up the input signal, and re-arrays the bits on the bit basis, in accordance with the interleaving position information, at a timing of generation of a bit sequence comprised of N bits, N being an optional natural number. The interleaver 10 then outputs the respective bits at a pre-set timing as an output signal.

Figure 8:
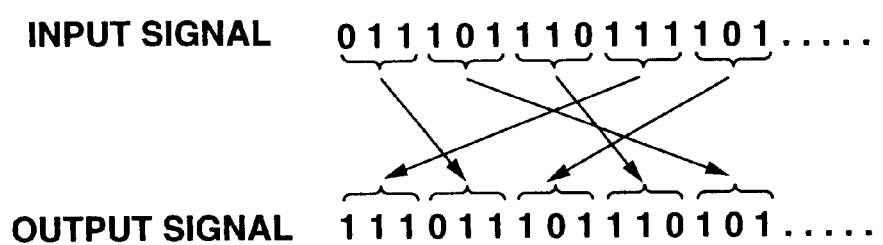
FIG. 8 illustrates the operation of an interleaver applied to a recording system of the magnetic recording and/or reproducing apparatus shown in FIG. 5 for applying modulation encoding block based interleaving.

On the other hand, an interleaver 20 interleaves data encoded by block modulation by a modulation encoder, provided at a pre-stage of the interleaver 20, on the modulation encoding block basis, that is on the symbol basis, to re-array the sequence of bits making up the data. For example, if the interleaver 20 re-arrays respective bits of data modulation-encoded to generate 3 output bits for 2 input bits in accordance with a conversion table shown in the following Table 3, the interleaver 20 re-arrays an input signal, as fed in a unit of three bits, as a modulation encoding block unit, in a unit of three bits, as shown in FIG. 8, to generate an output signal:

TABLE 3

Example of Conversion Table

| input bits | output bits |
|---|---|
| 00 | 011 |
| 01 | 101 |
| 10 | 111 |
| 11 | 110 |

More specifically, the interleaver 20 holds the interleaving position information of data determined on the basis of generated random numbers in e.g., a ROM (read-only memory), and re-arrays the input signal on the modulation code block basis, based on the interleaving position information. For example, the interleaver 20 sequentially holds the respective bits making up an input signal, and re-arrays the bits on the modulation encoding block basis, in accordance with the interleaving position information, at a timing of generation of the bit string made up of N bits, where N is an optional natural number, to output the re-arrayed bits at a pre-set timing as an output signal.

The decoder for modulation-decoding the modulation encoded signals, as a SISO type decoder applied to the reproducing system of the magnetic recording and/or reproducing apparatus, is explained with reference to FIGS. 9 and 10. It should be noted that, although the decoders 30, 40, shown in FIGS. 9 and 10, are shown as being the decoders for modulation-decoding the modulation-encoded signals, the decoder for the channel and the decoder for error correction decoding are also realized in a similar manner.

Figure 9:
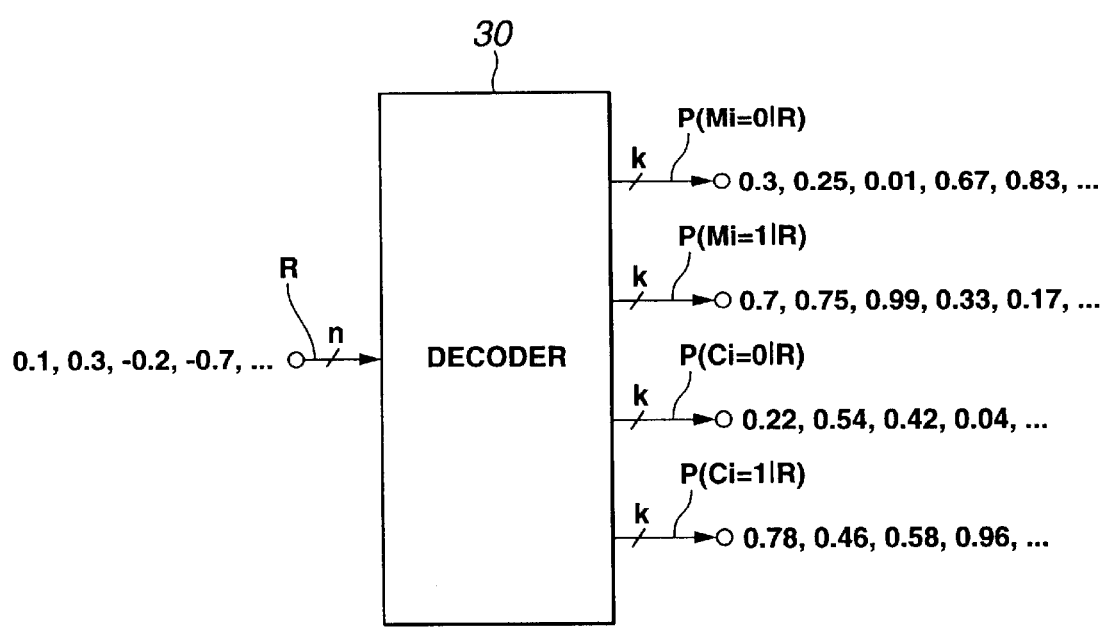
FIG. 9 illustrates an input/output example in a decoder applied to a reproducing system of the magnetic recording and/or reproducing apparatus of FIG. 5.
Figure 10:
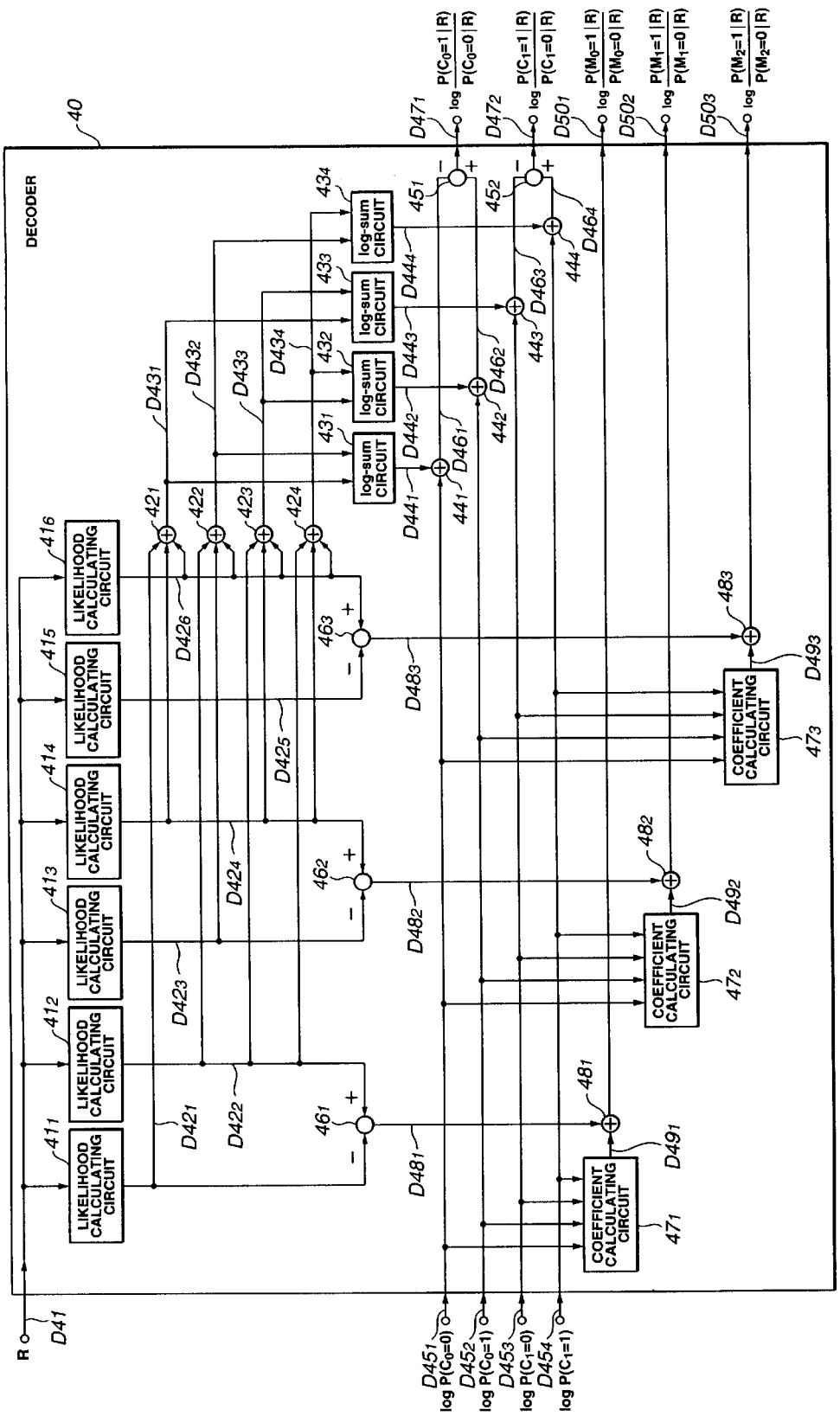
FIG. 10 is a block diagram for illustrating the structure of a decoder used in the reproducing system of the magnetic recording and/or reproducing apparatus shown in FIG. 5.

A decoder 30, shown in FIG. 9, decodes data encoded by block modulation, with the code rate R=k/n, where k is the number of input bits and n is the number of bits for modulation coding.

When fed with a reception signal R as the soft input, the decoder 30 calculates the probability $P(R_i=0|R)$ that the respective bits of this reception signal R are each "0" and the probability $P(R_i=1|R)$ that the respective bits of this reception signal R are each "1". Ultimately, the decoder 30 calculates a posterior probability information $P(M_i=0|R)$ and $P(M_i=1|R)$, as a soft decision value for a modulation code block M represented by $M=(M_0, M_1, \ldots, M_{n-1})$, and/or a posterior probability information $P(C_i=0|R)$ and $P(C_i=1|R)$, as a soft decision value for a modulation code input block C represented by $C=(C_0, C_1, \ldots, C_{k-1})$, to output the so-calculated information.

Instead of individually outputting the aforementioned posterior probability information, the decoder is also able to output the logarithmic value of the ratio of the posterior probability information, that is $\log(P(M_i=1|R)/P(M_i=0|R))$ or $\log(P(C_i=1|R)/P(C_i=0|R))$. These log values are routinely termed the log likelihood ratio and here denote the likelihood of the modulating code block M and the modulating code input block C on the occasion of inputting the reception signal R.

The decoder may also be fed with the priori probability information $P(C_i=0)$ and $P(C_i=1)$ for a modulation code input block C, instead of being fed with the aforementioned reception signal R.

Specifically, the decoder may, for example, be configured as shown in FIG. 10. In the following explanation, it is assumed that, for generating a three-bit output for a two-bit input, data to be decoded has been encoded in accordance with the conversion table shown in Table 3 given above.

The modulation decoder 40, shown in FIG. 10, includes six likelihood calculating circuits $41_1, 41_2, 41_3, 41_4, 41_5$ and $41_6$, as means for calculating the likelihood of each reception bit, four adders $42_1, 42_2, 42_3$ and $42_4$ for summing the data, four log-sum circuits $43_1, 43_2, 43_3$ and $43_4$ for performing the operations of $\log(e^A+e^B)$ on the two data A and B, four adders $44_1, 44_2, 44_3$ and $44_4$ for summing two data, five comparators $45_1, 45_2, 46_1, 46_2$ and $46_3$ for taking the ratio of the two data, coefficient calculating circuits $47_1, 47_2$ and $47_3$ for calculating coefficients for respective elements in the modulation encoding block M and three adders $48_1, 48_2$ and $48_3$ for adding two data. It is noted that the number six of the likelihood calculating circuits is derived from three bits multiplied by 2 equal to six bits.

The likelihood calculating circuits $41_1, 41_2, 41_3, 41_4, 41_5$ and $41_6$ are respectively fed with respective reception bits in a reception signal D41 (R) to calculate the likelihood of the respective reception bits.

That is, the likelihood calculating circuits $41_1$ is fed with the 0th bit of the three-bit reception signal D41 to calculate the log probability value $D42_1$ ($\log P(R_0=0|R)$) corresponding to the log value of the probability that this bit is "0". The likelihood calculating circuits $41_1$ sends the generated log probability value $D42_1$ to the adder $42_1$ and to the comparator $46_1$.

The likelihood calculating circuits $41_2$ is fed with the 0th bit of the three-bit reception signal D41 to calculate the log probability value $D42_2$ ($\log P(R_0=1|R)$) corresponding to the log value of the probability that this bit is "1". The likelihood calculating circuits $41_2$ sends the generated log probability value $D42_2$ to the adders $42_2, 42_3$ and $42_4$ and to the comparator $46_1$.

Then, the likelihood calculating circuits $41_3$ is fed with the first bit of the three-bit reception signal D41 to calculate the log probability value $D42_3$ ($\log P(R_1=0|R)$) corresponding to the log value of the probability that this bit is "0". The likelihood calculating circuits $41_3$ sends the generated log probability value $D42_3$ to the adder $42_2$ and to the comparator $46_2$.

The likelihood calculating circuits $41_4$ is fed with the first bit of the three-bit reception signal D41 to calculate the log probability value $D42_4$ ($\log P(R_1=1|R)$) corresponding to the log value of the probability that this bit is "1". The likelihood calculating circuits $41_4$ sends the generated log probability value $D42_4$ to the adder $42_1, 42_3$ and $42_4$ and to the comparator $46_2$.

Then, the likelihood calculating circuits $41_5$ is fed with the second bit of the three-bit reception signal D41 to calculate the log probability value $D42_5$ ($\log P(R_2=0|R)$)

corresponding to the log value of the probability that this bit is "0". The likelihood calculating circuits $41_5$ sends the generated log probability value $D42_5$ to the adder $42_4$ and to the comparator $46_3$.

The likelihood calculating circuits $41_6$ is fed with the second bit of the three-bit reception signal D41 to calculate the log probability value $D42_6$ (log $P(R_2=1|R)$) corresponding to the log value of the probability that this bit is "1". The likelihood calculating circuits $41_6$ sends the generated log probability value $D42_6$ to the adders $42_1$, $42_2$ and $42_3$ and to the comparator $46_3$.

The adder $D42_1$ sums the log probability value $D42_1$, supplied from the likelihood calculating circuits $41_1$, the log probability value $D42_4$, supplied from the likelihood calculating circuits $41_4$ and the log probability value $D42_6$, supplied from the likelihood calculating circuits $41_6$, to generate the likelihood value $D43_1$. That is, this likelihood value $D43_1$ is not other than the probability represented by log $P(R|M_0M_1M_2=011)$. The adder $D42_1$ sends the generated likelihood value $D43_1$ to the log-sum circuits $43_1$, $43_3$.

The adder $D42_2$ sums the log probability value $D42_2$, supplied from the likelihood calculating circuits $41_2$, the log probability value $D42_3$, supplied from the likelihood calculating circuits $41_3$ and the log probability value $D42_6$, supplied from the likelihood calculating circuits $41_6$ to generate the likelihood value $D43_2$. That is, this likelihood value $D43_2$ is not other than the probability represented by log $P(R|M_0M_1M_2=101)$. The adder $D42_2$ sends the generated likelihood value $D43_2$ to the log-sum circuits $43_1$, $43_4$.

The adder $D42_3$ sums the log probability value $D42_2$, supplied from the likelihood calculating circuits $41_2$, the log probability value $D42_4$, supplied from the likelihood calculating circuits $41_4$, and the log probability value $D42_6$, supplied from the likelihood calculating circuits $41_6$, to generate the likelihood value $D43_3$. That is, this likelihood value $D43_3$ is not other than the probability represented by log $P(R|M_0M_1M_2=111)$. The adder $D42_3$ sends the generated likelihood value $D43_3$ to the log-sum circuits $43_2$, $43_3$.

The adder $D42_4$ sums the log probability value $D42_2$, supplied from the likelihood calculating circuits $41_2$, the log probability value $D42_4$, supplied from the likelihood calculating circuits $41_4$ and the log probability value $D42_5$, supplied from the likelihood calculating circuits $41_5$, to generate the likelihood value $D43_4$. That is, this likelihood value $D43_4$ is not other than the probability represented by log $P(R|M_0M_1M_2=110)$. The adder $D42_4$ sends the generated likelihood value $D43_4$ to the log-sum circuits $43_2$, $43_4$.

The log-sum circuit $43_1$ performs an operation shown by the equation (4):

$$\log(e^{\log P(R|M_0M_1M_2=011)} + e^{\log P(R|M_0M_1M_2=101)}) = \log(P(R|M_0M_1M_2=011) + P(R|M_0M_1M_2=101)) \quad (4)$$

on the likelihood value $D43_1$ supplied from the adder $42_1$ and on the likelihood value $D43_2$ supplied from the adder $42_2$ to generate a likelihood value $D44_1$. The log-sum circuit $43_1$ sends the so-generated likelihood value $D44_1$ to the adder $44_1$.

The log-sum circuit $43_2$ performs an operation shown by the equation (5):

$$\log(e^{\log P(R|M_0M_1M_2=111)} + e^{\log P(R|M_0M_1M_2=110)}) = \log(P(R|M_0M_1M_2=111) + P(R|M_0M_1M_2=110)) \quad (5)$$

on the likelihood value $D43_3$ supplied from the adder $42_3$ and on the likelihood value $D43_4$ supplied from the adder $42_4$ to generate a likelihood value $D44_2$. The log-sum circuit $43_2$ sends the so-generated likelihood value $D44_2$ to the adder $44_2$.

The log-sum circuit $43_3$ performs an operation shown by the equation (6):

$$\log(e^{\log P(R|M_0M_1M_2=011)} + e^{\log P(R|M_0M_1M_2=111)}) = \log(P(R|M_0M_1M_2=011) + P(R|M_0M_1M_2=111)) \quad (6)$$

on the likelihood value $D43_1$ supplied from the adder $42_1$ and on the likelihood value $D43_3$ supplied from the adder $42_3$ to generate a likelihood value $D44_3$. The log-sum circuit $43_3$ sends the so-generated likelihood value $D44_3$ to the adder $44_3$.

The log-sum circuit $43_4$ performs an operation shown by the equation (7):

$$\log(e^{\log P(R|M_0M_1M_2=101)} + e^{\log P(R|M_0M_1M_2=110)}) = \log(P(R|M_0M_1M_2=101) + P(R|M_0M_1M_2=110)) \quad (7)$$

on the likelihood value $D43_2$ supplied from the adder $42_2$ and on the likelihood value $D43_4$ supplied from the adder $42_4$ to generate a likelihood value $D44_4$. The log-sum circuit $43_4$ sends the so-generated likelihood value $D44_4$ to the adder $44_4$.

The adder $44_1$ sums the likelihood value $D44_1$ supplied from the log-sum circuit $43_1$ and the log priori probability $D45_1$ (log $P(C_0=0)$) for an input bit, fed from outside, to generate the log probability value $D46_1$. This log probability value $D46_1$ denotes the probability shown by the following equation (8):

$$\log P(C_0=0|R) = \log \{P(R|M_0M_1M_2=011)\} + \log P(C_0=0) \quad (8).$$

The adder $44_1$ sends the generated log probability value $D46_1$ to a comparator $45_1$.

The adder $44_2$ sums the likelihood value $D44_2$ supplied from the log-sum circuit $43_2$ and the log priori probability $D45_2$ (log $P(C_0=1)$) for an input bit, input from outside, to generate the log probability value $D46_2$. This log probability value $D46_2$ denotes the probability shown by the following equation (9):

$$\log P(C_0=1|R) = \log\{P(R|M_0M_1M_2=111) + (R|M_0M_1M_2=110)\} + \log P(C_0=1) \quad (9).$$

The adder $44_2$ sends the generated log probability value $D46_2$ to a comparator $45_1$.

The adder $44_3$ sums the likelihood value $D44_3$ supplied from the log-sum circuit $43_3$ and the log priori probability $D45_3$ (log $P(C_1=0)$) for an input bit, input from outside, to generate the log probability value $D46_3$. This log probability value $D46_3$ denotes the probability shown by the following equation (10):

$$\log P(C_1=0|R) = \log\{P(R|M_0M_1M_2=011) + (R|M_0M_1M_2=111)\} + \log P(C_1=0) \quad (10).$$

The adder $44_3$ sends the generated log probability value $D46_3$ to the comparator $45_2$.

The adder $44_4$ sums the likelihood value $D44_4$ supplied from the log-sum circuit $43_4$ and the log priori probability $D45_4$ (log $P(C_1=1)$) for an input bit, input from outside, to generate the log probability value $D46_4$. This log probability value $D46_4$ denotes the probability shown by the following equation (11):

$$\log P(C_1=1|R) = \log\{P(R|M_0M_1M_2=101) + (R|M_0M_1M_2=110)\} + \log P(C_1=1) \quad (11).$$

The adder $44_4$ sends the generated log probability value $D46_4$ to a comparator $45_2$.

The comparator $45_1$ takes the ratio of the log probability value $D46_1$ supplied from the adder $44_1$ and the log probability value $D46_2$ supplied from the adder $44_2$ to generate the decoded log posterior probability ratio $D47_1$ ($\log(P(C_0=1|R)/P(C_0=0|R))$) which is output to outside.

The comparator $45_2$ takes the ratio of the log probability value $D46_3$ supplied from the adder $44_3$ and the log probability value $D46_4$ supplied from the adder $44_4$ to generate the decoded log posterior probability ratio $D47_2$ ($\log(P(C_1=1|R)/P(C_1=0|R))$) which is output to outside.

The comparator $46_1$ takes the ratio of the log probability value $D42_1$ supplied from the likelihood calculating circuit $41_1$ and the log probability value $D42_2$ supplied from the likelihood calculating circuit $41_2$ to generate the log posterior probability ratio $D48_1$ ($\log(P(M_0=1|R)/P(M_0=0|R))$) which is output to the adder $48_1$.

The comparator $46_2$ takes the ratio of the log probability value $D42_3$ supplied from the likelihood calculating circuit $41_3$ and the log probability value $D42_4$ supplied from the likelihood calculating circuit $41_4$ to generate the log posterior probability ratio $D48_2$ ($\log(P(M_1=1|R)/P(M_1=0|R))$) which is output to the adder $48_2$.

The comparator $46_3$ takes the ratio of the log probability value $D42_5$ supplied from the likelihood calculating circuit $41_5$ and the log probability value $D42_6$ supplied from the likelihood calculating circuit $41_6$ to generate the log posterior probability ratio $D48_3$ ($\log(P(M_2=1|R)/P(M_2=0|R))$) which is output to the adder $48_3$.

The coefficient calculating circuit $47_1$ calculates the $M_0$ coefficient, represented by the following equation (12):

$$\alpha = \log \frac{P(C_0=0) \cdot P(C_1=1) + P(C_0=1) \cdot P(C_0=1) \cdot P(C_1=1)}{P(C_0=0) \cdot P(C_1=0)} \quad (12)$$

that is a coefficient $\alpha$ for the modulation code $M_0$ equivalent to the 0th bit making up the three-bit reception signal $D41$, based on the log priori probability $D45_1$, $D45_2$, $D45_3$ and $D45_4$ for the input bit supplied from outside, to generate a $M_0$ coefficient signal $D49_1$. The coefficient calculating circuit $47_1$ sends the generated $M_0$ coefficient $D49_1$ to the adder $48_1$.

The coefficient calculating circuit $47_2$ calculates the $M_1$ coefficient, represented by the following equation (13):

$$\beta = \log \frac{P(C_0=0) \cdot P(C_1=0) + P(C_0=1)P(C_1=0) + P(C_0=1) \cdot P(C_1=1)}{P(C_0=0) \cdot P(C_1=1)} \quad (13)$$

that is a coefficient $\beta$ for the modulation code $M_1$ equivalent to the first bit making up the three-bit reception signal $D41$, based on the log priori probability $D45_1$, $D45_2$, $D45_3$ and $D45_4$ for the input bit supplied from outside, to generate a $M_1$ coefficient signal $D49_2$. The coefficient calculating circuit $47_2$ sends the generated $M_1$ coefficient $D49_2$ to the adder $48_2$.

The coefficient calculating circuit $47_3$ calculates the $M_2$ coefficient, represented by the following equation (14):

$$\gamma = \log \frac{P(C_0=0) \cdot P(C_1=0) + P(C_0=0) \cdot P(C_1=1) + P(C_0=1) \cdot P(C_1=0)}{P(C_0=1) \cdot P(C_1=1)} \quad (14)$$

that is a coefficient $\gamma$ for the modulation code $M_2$ equivalent to the second bit making up the three-bit reception signal $D41$, based on the log priori probability $D45_1$, $D45_2$, $D45_3$ and $D45_4$ for the input bit supplied from outside, to generate a $M_2$ coefficient signal $D49_3$. The coefficient calculating circuit $47_3$ sends the generated $M_2$ coefficient $D49_3$ to the adder $48_3$.

The adder $48_1$ sums the log posterior probability ratio $D48_1$, supplied from the comparator $46_1$, to the $M_0$ coefficient signal $D49_1$ supplied from the coefficient calculating circuit $D47_1$. The adder $48_1$ outputs the decoded channel log posterior probability ratio signal $D50_1$($\log(P(M_0=1|R)/P(M_0=0|R))$) to outside.

The adder $48_2$ sums the log posterior probability ratio $D48_2$, supplied from the comparator $46_2$, to the $M_1$ coefficient signal $D49_2$ supplied from the coefficient calculating circuit $47_2$. The adder $48_2$ outputs the decoded channel log posterior probability ratio signal $D50_2$($\log(P(M_1=1|R)/P(M_1=0|R))$) to outside.

The adder $48_3$ sums the log posterior probability ratio $D48_3$, supplied from the comparator $46_3$, to the $M_1$ coefficient signal $D49_3$ supplied from the coefficient calculating circuit $47_3$. The adder $48_3$ outputs the decoded channel log posterior probability ratio signal $D50_3$($\log(P(M_2=1|R)/P(M_2=0|R))$) to outside.

The decoder 40, having the components as described above, has the likelihood calculating circuits $41_1$, $41_2$, $41_3$, $41_4$, $41_5$ and $41_6$ for calculating the likelihood of respective reception bits in the reception signals $D41$ (R) taking analog values under the effect of the noise generated in the course of transmission, as soft input, that is the respective output codewords on the modulation coder side. By these likelihood calculating circuits $41_1$, $41_2$, $41_3$, $41_4$, $41_5$ and $41_6$, the modulation decoder 40 finds the likelihood of the respective codewords and uses the likelihood values, thus found, to find the posterior probability information straightforwardly, as soft decision values for the input and output bits on the modulation coder side.

Meanwhile, the decoder 40 is fed from outside with log priori probability $D45_1$, $D45_2$, $D45_3$, $D45_4$. If the probability of the respective bits making up the binary signal input to the modulation coder, not shown, being "0", is equivalent to the same probability being "1", there is no necessity of inputting the log priori probability $D45_1$, $D45_2$, $D45_3$, $D45_4$, it being only necessary to handle the same as if the values of these log priori probability $D45_1$, $D45_2$, $D45_3$, $D45_4$ are all equal to zero.

Although the above explanation is based on the assumption that the modulation decoder 40 decodes data obtained on modulation-coding a 2-bit input to a 3-bit output, the modulation decoder is not limited as to the number of bits of the input or the output and may be configured as described above in keeping with the number of bits of the input or the output used.

Figure 11:
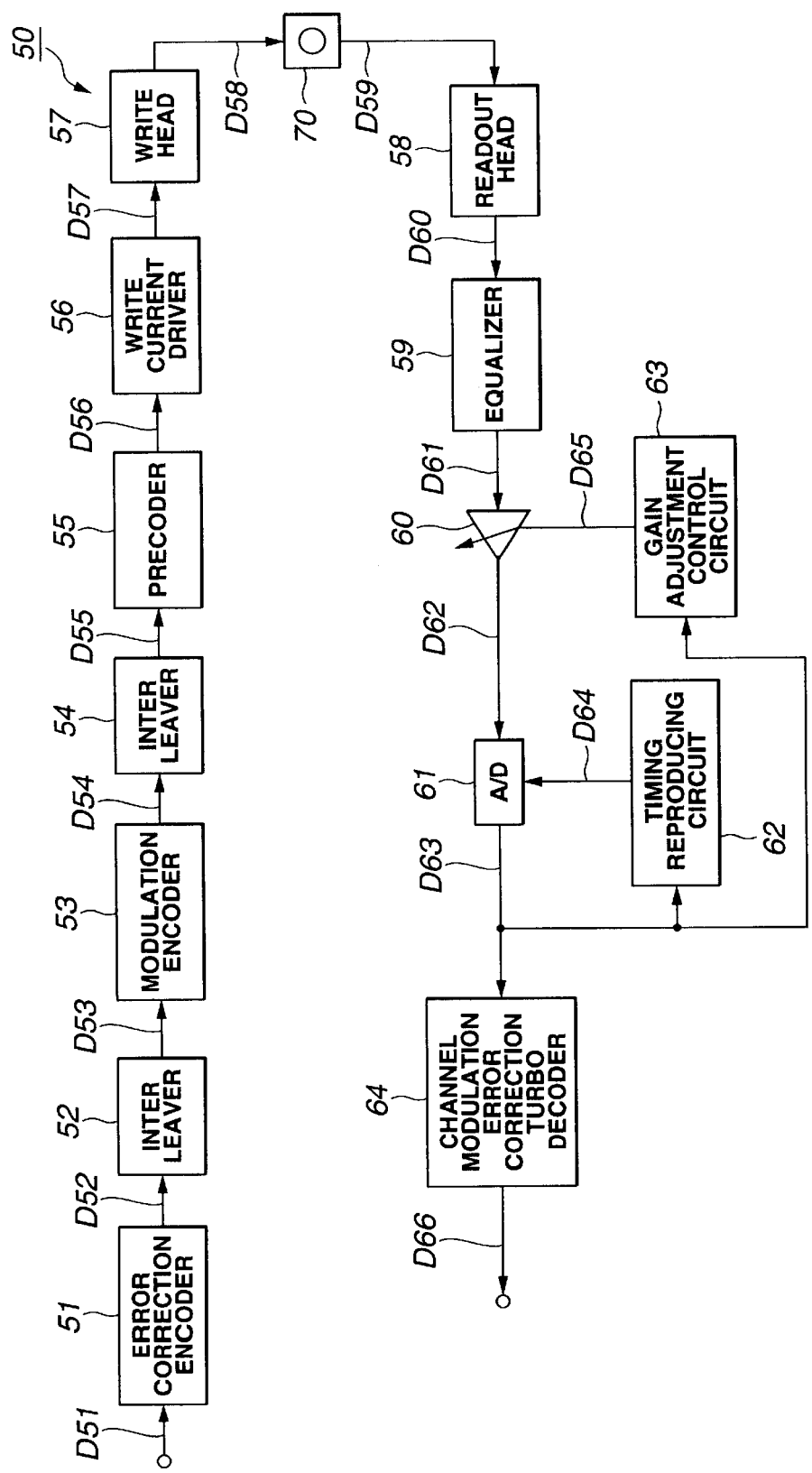
FIG. 11 is a block diagram for illustrating the structure of the recording and/or reproducing apparatus shown in FIG. 5.

Referring to FIG. 11, the magnetic recording and/or reproducing apparatus, employing this interleaver and decoder, is hereinafter explained.

A magnetic recording and/or reproducing apparatus 50, shown in FIG. 11, includes, as a recording system for recording data on a recording medium 70, an error correction coder 51 for error correction coding input data, interleavers 52, 54 for re-arraying the input data, a modulation encoder 53 for modulation encoding input data, a precoder 55 for filtering the input data for compensating for channel characteristics, a write current driver 56 for converting respective bits of the input data into write current values, and a write head 57 for recording data on a recording medium 70.

The error correction coder 51, as error correction encoding means, applies error correction coding to the input data D51. The error correction coder 51 sends the error correction encoded data D52, generated on error correction coding, to the downstream side interleaver 52.

The interleaver 52, as first interleaving means, is constructed as the aforementioned interleaver 10, interleaving the error correction encoded data D52, error correction coded by the error correction coder 51, on the bit basis, to re-array the sequence of bits making up the error correction encoded data D52. The interleaver 52 sends the generated interleaved data D53 to the downstream side modulation encoder 53.

The modulation encoder 53 as modulation encoding means applies predetermined modulation coding to the interleaved data D53, supplied from the interleaver 53, thereby generating a modulation encoded signal D54 as a sequence subjected to limitations. The modulation encoder 53 routes the so-generated modulation encoder data D54 to the downstream side interleaver 54.

The interleaver 54, as second interleaving means, is constructed as the aforementioned interleaver 20, interleaving the modulation encoded data D54, obtained on encoding by block modulation by the modulation encoder 53, on the modulation encoding block basis, to re-array the sequence of bits making up the modulation encoded data D54. The interleaver 54 sends so-generated interleaved data D55 to the downstream side precoder 55.

The precoder 55, as precoding means, filters the interleaved data D55, supplied from the interleaver 54, such as to compensate for channel characteristics from the data writing on the recording medium 70 up to data outputting at the equalizer 59, to generate a precode signal D56 as a binary signal. For example, if the channel has 1-D characteristics, the precoder 55 performs filtering F represented by the following equation (15):

$$F=1/(1 \oplus D) \quad (15)$$

where $\oplus$ denotes exclusive-OR. The precoder 55 sends the generated precode signal D56 to the downstream side write current driver 56.

The write current driver 56 converts respective bits of the precode signal D56, supplied from the precoder 55, into the write current value $I_S$, so that 0 and 1 will be converted to $-I_S$ and $+I_S$ ($0 \rightarrow -I_S$, $1 \rightarrow +I_S$), respectively, to generate a write current signal D57. The write current driver 56 sends the so-generated write current signal D57 to the downstream side write head 57.

The write head 57 routes a write magnetic signal D58, conforming to the write current signal D57, supplied from the write current driver 56, to the recording medium 70 to record data thereon.

When recording data on the recording medium 70, the recording system in this magnetic recording and/or reproducing apparatus 50 applies error correction coding to the input data D51, by the error correction coder 51, to produce error correction coded data D52, which then is interleaved by the interleaver 52 on the bit basis. The recording system also modulation encodes the interleaved data D53 in a predetermined fashion by the modulation encoder 53, while interleaving the modulation encoded data D54 on the modulation encoding block basis, by the interleaver 54, to generate a precode signal D56 by the precoder 55.

The recording system records the precode signal D56, generated by the precoder 55, on the recording medium 70, through the write current driver 56 and the write head 57.

The recording system in the magnetic recording and/or reproducing apparatus thus includes the interleavers 52, 54 downstream of the error correction coder 51 and the modulation encoder 53, respectively, and executes serial concatenated coding between the error correction encoder 51, modulation encoder 53 and the precoder 55 to realize high performance encoding as error correction encoding, modulation encoding and as encoding for the channel.

On the other hand, the magnetic recording and/or reproducing apparatus 50 includes, as a reproducing system for reproducing the data recorded on the recording medium 70, a readout head 58 for reading out data recorded on the recording medium 70, an equalizer 59 for equalizing input data, a gain adjustment circuit 60 for adjusting the gain of the input data, an analog/digital (A/V) converter 61 for converting analog data into digital data, a timing reproducing circuit 62 for reproducing clocks, a gain adjustment control circuit 63 for controlling the gain adjustment circuit 60 and a channel, modulation and error correction turbo decoder 64 for turbo decoding the input data.

The readout head 58 reads out a readout magnetic signal D59 from the recording medium and generates a readout current signal D60 corresponding to this readout magnetic signal D58. The readout head 58 sends the generated readout current signal D60 to the downstream side equalizer 59.

The equalizer 59 equalizes the readout current signal D60, supplied from the readout head 58, so that the channel response from data writing on the recording medium 70 in the recording system up to outputting thereof in the equalizer 59 will be of pre-set characteristics, such as 1-D, to generate an equalized signal D61. The equalizer 59 sends the generated equalized signal D61 to the downstream side gain adjustment circuit 60.

The gain adjustment circuit 60 adjusts the gain of the equalized signal D61, supplied from the equalizer 59, based on the gain adjustment control signal D65 supplied from the gain adjustment control circuit 63, to generate a digital channel signal D62. The gain adjustment circuit 60 sends the generated gain adjustment signal D62 to the downstream side A/D converter 61.

The A/D converter 61 samples the gain adjustment signal D62 supplied from the gain adjustment circuit 60, based on the clock signal D64 supplied from the timing generating circuit 62, to digitize the gain adjustment signal D62 to generate the digital channel signal D63. The A/D converter 61 routes the generated digital channel signal D63 to the timing generating circuit 62, gain adjustment control circuit 63 and to the channel, modulation and error correction turbo decoder 64.

The timing generating circuit 62 regenerates clocks from the digital channel signal D63, supplied from the A/D converter 61, to generate clock signals D64. The timing generating circuit 61 routes the generated clock signals D64 to the A/D converter 61.

Based on the digital channel signal D63, supplied from the A/D converter 61, the gain adjustment control circuit 63 generates a gain adjustment control signal D65, which is a control signal used for maintaining the amplitude of the equalized signal D61 at an expected value. The gain adjustment control circuit 63 sends the generated gain adjustment control signal D65 to the gain adjustment circuit 60.

The channel, modulation and error correction turbo decoder 64 effectuates turbo decoding by concatenating SISO decoders configured as the aforementioned decoders 30, 40. The channel, modulation and error correction turbo decoder 64 turbo-decodes the input digital channel signal D63, supplied from the A/D converter 61, in a manner which will be explained subsequently, to output the decoded result as soft or hard output data D66 to outside.

Figure 12:
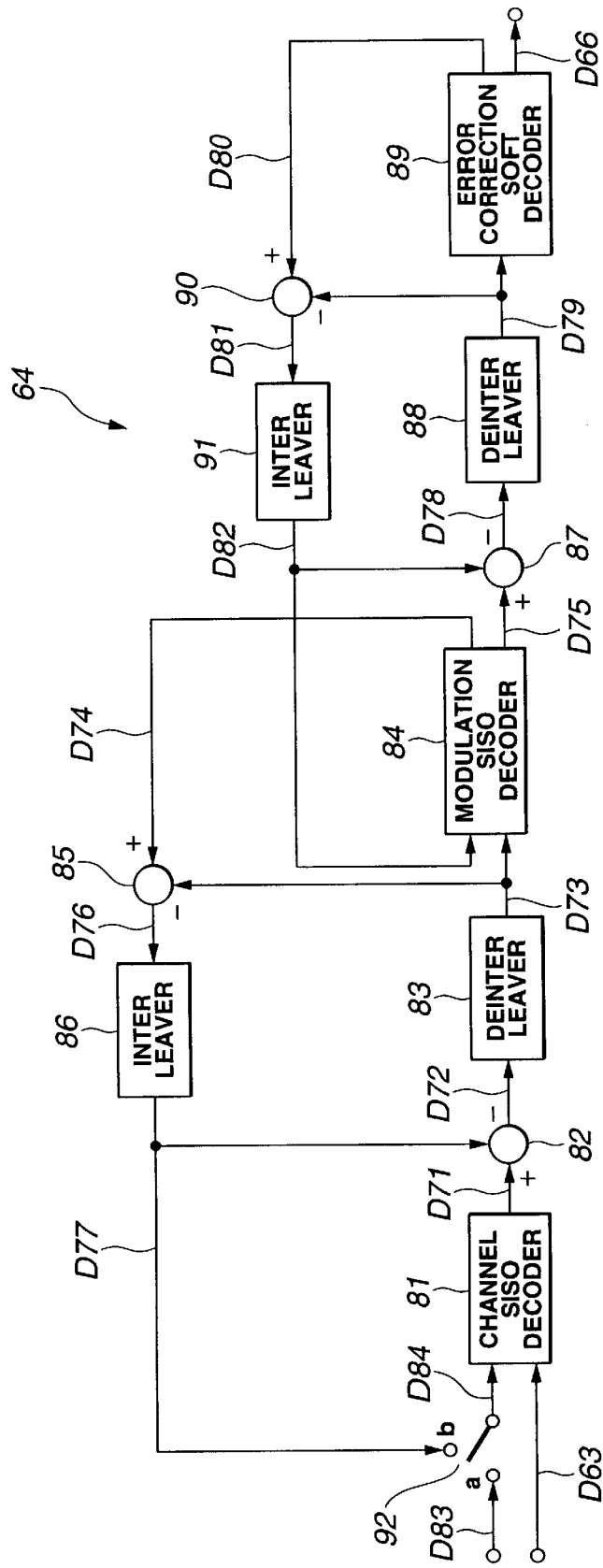
FIG. 12 is a block diagram for illustrating the structure of a channel and a modulation and error correction turbo decoder provided in the reproducing system of the recording and/or reproducing apparatus shown in FIG. 5.

Referring to FIG. 12, the channel, modulation and error correction turbo decoder 64 will be explained in detail.

In FIG. 12, the channel, modulation and error correction turbo decoder 64 includes a channel SISO decoder 81, as an SISO decoder for decoding the channel response from the pre-stage of the precoder 55 in the recording system to an output of the equalizer 59 in the reproducing system, deinterleavers 83, 88 for restoring the sequence of the input data to the original sequence, a modulation SISO decoder 84, as a SISO decoder for modulation decoding the input data, interleavers 86, 91 for re-arraying the sequence of the input data, an error correction soft decoder 89 for applying error correction soft decoding to input data, a changeover switch 92 for switching data input as priori probability information for an information bit, and four difference taking units 82, 85, 87, 90.

The channel SISO decoder 81, as channel decoder means, is constructed as the aforementioned decoders 30, 40, and is a SISO decoder. The channel SISO decoder 81 is fed with the digital channel signal D63, as soft input supplied from the A/D converter 61, as a soft input, supplied from the A/D converter 61, and with a priori probability information signal D84, as selected by the changeover switch 92 from the priori probability information signal D77 for the information bit as a soft input supplied from the interleaver 86 or the priori probability information signal D83 for an information bit having a value of "0", to soft-output-decode the channel response $R_{ch}$ from the pre-stage of the precoder 55 in the recording system to an output in the equalizer 59 in the reproducing system, based on the aforementioned BCJR algorithm and on the SOVA algorithm for example, the channel response $R_{ch}$ represented by the following equation (16):

$$R_{ch}=(1-D)/(1 \oplus D) \quad (16)$$

where $\oplus$ denotes exclusive-OR. If the interleaved data D55 prior to pre-coding by the precoder 55 is represented as C(t) ($0 \leq t \leq N$), the channel SISO decoder 81 calculates the log posterior probability ratio log(P(C(t)=1)/P(C(t)=0)), which is the posterior probability information for C(t), to send this log posterior probability ratio as the channel decoded signal D71 to the downstream side difference taking unit 82. Meanwhile, the channel SISO decoder 81 is not limited to the above-described decoders 30, 40, since it is sufficient if the channel SISO decoder 81 is constructed as a SISO decoder. For example, the channel SISO decoder 81 may be such a one which performs soft output decoding based on the aforementioned BCJR algorithm or on the SOVA algorithm.

The difference taking unit 82 takes the difference between the channel decoded signal D71, as a soft input, supplied from the channel SISO decoder 81, and the priori probability information signal D77, as a soft input, supplied from the interleaver 86, to output data represented by the difference value as a soft output to the post-stage deinterleaver 83, as the channel extrinsic information signal D72, which is the extrinsic information to an information bit as found by the code constraint condition. Meanwhile, this channel extrinsic information signals D72 corresponds to the interleaved data D55 obtained by the interleaver 54 of the recording system.

The deinterleaver 83, as first interleaving means, deinterleaves the channel extrinsic information signals D72, as a soft input, supplied from the difference taking unit 82, in order to restore the bit sequence of the interleaved data D55 from the interleaver 54 of the recording system to the bit sequence of the original modulation encoded data D54. The deinterleaver 83 sends the deinterleaved data to the modulation SISO decoder 84 and to the difference taking unit 85 as the deinterleaved signal D73 which is the priori probability information to the code bit in the modulation SISO decoder 84.

The modulation SISO decoder 84 as modulation decoding means is constructed as the aforementioned decoders 30, 40, and is a SISO type decoder. It is assumed that, by the modulation encoding with the code rate R=K/N by the modulation encoder 53, the modulation encoded data D54 after the modulation encoding by the modulation encoder 53 is expressed as M(t) ($0 \leq t<N$) and that the input data D53 prior to modulation encoding by the modulation encoder 53 is expressed as E(t) ($0 \leq t<N$). The modulation SISO decoder 84 is fed with a deinterleaved signal D73 as soft input from the deinterleaver 83 and with the interleaved signal D82 as a soft input from the interleaver 91. The modulation SISO decoder 84 calculates the log posterior probability ratio log(P(M(t)=1)/P(M(t)=0)), as the posterior probability information for M(t), and the log posterior probability ratio log(P(E(t)=1)/P(E(t)=0)), as the posterior probability information for E(t). The modulation SISO decoder 84 routes this log posterior probability ratio for M(t) as the modulation channel decoded signal D74 to the difference taking unit 85, while routing the log posterior probability as the posterior probability information for E(t) as the modulation decoded signal D75 to the difference taking unit 87.

The difference taking unit 85 finds a difference between the modulation channel decoded signal D74, as a soft input, supplied from the modulation decoder 84, and the deinterleaved signal D73, as a soft input, supplied from the deinterleaver 83, to route the data represented by this difference value as a soft output to the downstream side interleaver 86 as the modulation error correction extrinsic information signals D76 to the code bit as found by the code constraint condition.

The interleaver 86, as the third interleaving means, interleaves the modulation error correction extrinsic information signals D76, as a soft input fed from the difference taking unit 85, on the modulation encoding block basis, in accordance with the same interleaving position information as that of the interleaver 54 of the recording system. The interleaver 86 sends the interleaved data to the channel SISO decoder 81 and to the difference taking unit 82 as being the priori probability information signal D77 for the information bit in the channel SISO decoder 81.

The difference taking unit 87 takes the difference between the modulation decoded signal D75, as a soft input, supplied from the modulation SISO decoder 84, and the interleaved signal D82, as a soft input, supplied from the interleaver 91, to output data represented by ths difference value as a soft output to the post-stage deinterleaver 88, as the modulation extrinsic information signals D78 as the extrinsic information to an information bit as found by the code constraint condition. Meanwhile, this modulation extrinsic information signals D78 corresponds to the interleaved data D53 as interleaved by the interleaver 52 of the recording system.

The deinterleaver 88, as second deinterleaving means, deinterleaves the modulation extrinsic information signals D78, as a soft input, supplied from the difference taking unit 87, in order to restore the bit sequence of the interleaved data D53 from the interleaver 52 of the recording system to the bit sequence of the original error correction encoded data D52. The deinterleaver 88 sends the deinterleaved data to the error correction soft decoder 89 and to the difference taking unit 90 as the deinterleaved signal D79 which is the priori probability information to the code bit in the error correction soft decoder 89.

The error correction soft decoder 89 as error correction decoding means is constructed as the aforementioned decoders 30, 40 and is an SISO decoder. That is, the error correction soft decoder 89 performs soft decoding of the deinterleaved signal D79 as soft input supplied from the deinterleaver 88, based on the aforementioned BCJR algorithm or on the SOVA algorithm. It is assumed that the error correction encoded data D52 following error correction coding by the error correction coder 51 in the recording system is expressed as E(t) ($0 \leq t<L$) and that the input data prior to error correction coding by the error correction coder 51 is expressed as I(t) ($0 \leq t<K$). The error correction soft decoder 89 calculates the log posterior probability ratio log(P(E(t)=1)/P(E(t)=0)), as the posterior probability information for E(t), and sends the log posterior probability ratio as the error correction decoded signal D80 to the difference taking unit 90. The error correction soft decoder 89 also calculates the log posterior probability ratio log(P(I(t)=1)/P(I(t)=0)), as the posterior probability information for I(t), to route the decoded result corresponding to the log posterior probability ratio as the soft or hard output data D66 to outside.

The difference taking unit 90 finds a difference value between the error correction decoded signal D80, as a soft input, supplied from the error correction soft decoder 89, and the deinterleaved signal D79 as a soft input from the deinterleaver 88, and outputs data given as this difference value to the post-stage interleaver 91 as a soft output as the error correction extrinsic information signals D81 which is the extrinsic information to the code bit as found by the code constraint condition.

The interleaver 91, as the fourth interleaving means, interleaves the error correction extrinsic information signals D81, as a soft input fed from the difference taking unit 90, based on the same interleaving position information as that of the interleaver 52 of the recording system. The interleaver 91 sends the interleaved data to the modulation SISO decoder 84 and to the difference taking unit 87 as being the priori probability information signal D82 for the information bit in the modulation SISO decoder 84.

In the initial stage of the decoding, the changeover switch 92 is set to the fixed terminal a supplying a value 0 corresponding to the priori probability information signal D83 to select the priori probability information signal D83 as being the priori probability information signal D84 for an information bit in the channel SISO decoder 81. The changeover switch 92 then is set to a fixed terminal b supplying the priori probability information signal D77 supplied from the interleaver 86 to select the priori probability information signal D77 as being the priori probability information signal D84.

The channel, modulation and error correction turbo decoder 64, is provided with the error correction soft decoder 89, modulation SISO decoder 84 and with the channel SISO decoder 81, as counterparts to the error correction coder 51, modulation encoder 53 and the precoder 55 of the recording system, respectively, as described above, to decompose the code of high decoding complexity into elements with lower decoding complexity, such as to sequentially improve characteristics by the interaction between the channel SISO decoder 81, modulation SISO decoder 84 and the error correction soft decoder 89. If fed with the digital channel signal D63, as a soft input, from the A/D converter 61, the channel, modulation and error correction turbo decoder 64 iterates the decoding operations from the channel SISO decoder to the error correction soft decoder 89 a pre-set number of times, such as several to tens of times, to output the soft-output log posterior probability ratio, obtained on decoding a pre-set number of times, directly to outside as the soft output data D66, or binary-codes the ratio by a binary coding circuit, not shown, into binary signal which is then output as hard output data D66 to outside.

In reproducing data recorded on the recording medium 70, the reproducing system of the magnetic recording and/or reproducing apparatus 50, turbo-decodes the soft-input digital channel signal D63, generated through the readout head 58, equalizer 59, gain adjustment circuit 60 and the A/D converter 61, by the channel, modulation and error correction turbo decoder 64, to generate output data D66 corresponding to the input data D51 input to the error correction coder 51 in the recording system.

The reproducing system of the magnetic recording and/or reproducing apparatus 50 is provided in this manner with the channel, modulation and error correction turbo decoder 64 and performs turbo decoding between the error correction soft decoder 89, modulation SISO decoder 84 and the channel SISO decoder 81, as counterparts to the error correction coder 51, modulation encoder 53 and the precoder 55 of the recording system, respectively, to realize the decoding in meeting with the channel response, modulation encoding and error correction encoding.

In the above-described magnetic recording and/or reproducing apparatus 50, in which the interleaver 52 is provided in the recording system on the post-stage of the error correction coder 51 and the interleaver 54 is provided on the post-stage of the modulation encoder 53 to execute encoding by serial concatenated coding between the error correction coder 51, modulation encoder 53 and the precoder 55. In addition, the magnetic recording and/or reproducing apparatus 50 is provided on the reproducing system with the channel, modulation and error correction turbo decoder 64 to effect turbo decoding to realize high performance decoding. In addition, turbo decoding with high efficiency can be realized by exploiting the soft information for the entire decoding processing for the code, thus eliminating the necessity of diminishing the information to lower the decoding error rate significantly.

The second embodiment of the magnetic recording and/or reproducing apparatus is now explained. The magnetic recording and/or reproducing apparatus executes encoding as correlation is afforded to fore and aft side data instead of executing coding/decoding on the block basis. In addition, the magnetic recording and/or reproducing apparatus performs trellis decoding conforming to the constraint condition.

An interleaver used for the recording system of the magnetic recording and/or reproducing apparatus is first explained.

An interleaver applied to the recording system, such a system which is configured similarly to the interleaver 10 shown in FIG. 5 and in which data is interleaved on the bit basis to re-array the data bit sequence, or such a system which is configured similarly to the interleaver 20 shown in FIG. 6 and which interleaves data based on the modulation encoding block basis of the trellis to re-array the bits making up the data in the data sequence, may be used. Since the interleaver interleaving the data on the bit basis has already been explained hereinabove, it is not explained here. Instead, an interleaver interleaving the data based on the modulation encoder block of the trellis is explained briefly.

It is assumed here that the bit sequence of the data from the modulation encoding of generating three output bits for two input bits in accordance with the conversion table shown in Table 3 by an interleaver interleaving the data based on the modulation encoder block of the trellis is to be re-arrayed. If the constraint condition to be met by the modulation encoded data is (d, k)=(0, 2) limitation, the interleaver generates a sequence in meeting with the (d, k)=(0, 4) limitation.

The interleaver is not limited to such a one interleaving the data based on the modulation encoding block of the trellis, so that any suitable interleaver interleaving the data such as to meet the pre-set constraint condition following interleaving may be used.

Referring to FIGS. 13 to 16, the encoder used in the recording system and the SISO decoder used for the reproducing system of the magnetic recording and/or reproducing apparatus is explained. It is noted that, although the coder and the decoder, used for modulation encoding and modulation decoding, respectively, are shown here, the coder and the decoder for the channel are configured in a similar fashion.

The magnetic recording and/or reproducing apparatus performs modulation encoding and modulation decoding, based on a common trellis. Although the trellis structure is changed depending on limitations imposed on the modulation code, the modulation encoding and modulation decoding, satisfying the (d, k)=(0, 2) limitations, with the code rate R=2/3, is here explained.

Figure 13:
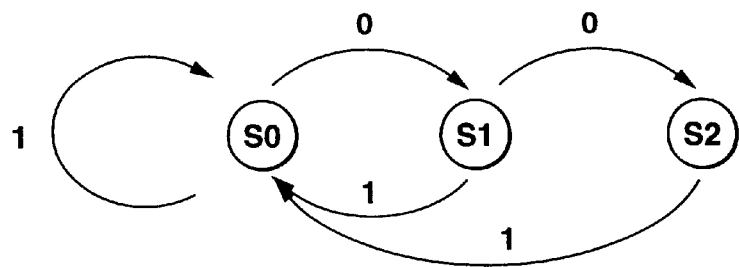
FIG. 13 illustrates the status transition diagram for generating codes satisfying the (d, k)=(0, 2) limitations.

FIG. 13 shows a diagram showing the status transition for generating a code satisfying the (d, k)=(0, 2) limitations. In FIG. 13, labels affixed between the respective states indicate bits output in case of status transition. For example, if the status transition that has occurred is "S0→S1→S2", an output bit string is "00". The bit string output in case status transition has occurred in accordance with the aforementioned status transition diagram necessarily satisfies the (d, k)=(0, 2) limitations.

Assume that the modulation encoding of outputting a 3 bit modulated code for a 2-bit input, with the code rate R=2/3. For generating the modulation code satisfying the (d, k)=(0, 2) limitations, it is apparently sufficient if status transition occurs thrice in accordance with the status transition diagram shown in FIG. 13, with the resulting output being a modulated code.

Figure 14:
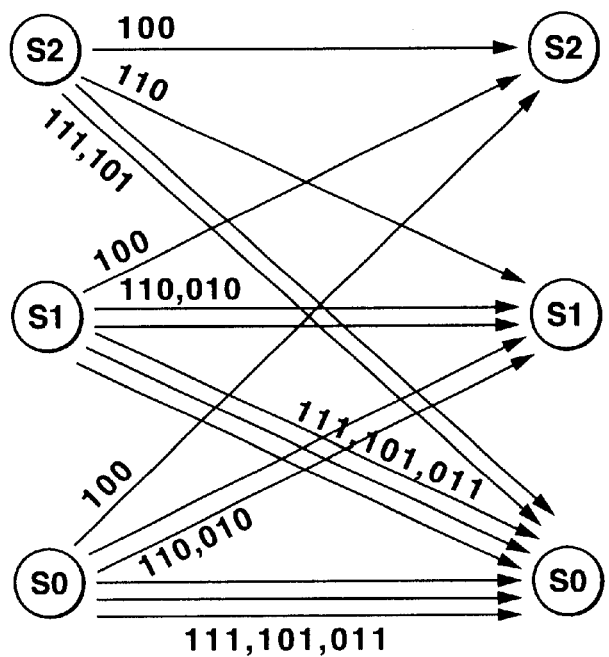
FIG. 14 illustrates the trellis when status transition has occurred thrice in accordance with the status transition diagram shown in FIG. 13.

The trellis when the status transition has occurred thrice in accordance with the status transition diagram shown in FIG. 13, that is, a diagram obtained on developing the status transition diagram along the time axis direction, is as shown in FIG. 14. For example, in the trellis shown in FIG. 14, a branch lying at an uppermost position indicates that there is one path starting at the status S2 and again getting to the status S2 after three status transitions, with a corresponding output being "100".

Figure 15:
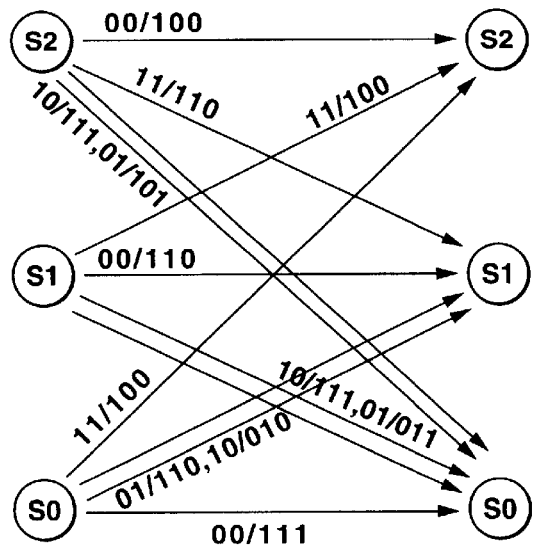
FIG. 15 illustrates the trellis constructed on branch selection from the trellis shown in FIG. 14.

In case of modulation encoding of outputting the 3-bit modulated code for a 2-bit input, $2^2$=4 branches are selected from each state, these branches being then allocated to 2-bit inputs of "00, 01, 10, 11" to form a trellis in which an input is associated with an output. FIG. 15 shows a trellis formed on branch selection as described above. In FIG. 15, each label affixed between different states indicate an input/output. For example, in the trellis shown in FIG. 15, a branch S0→S2 indicates that, if "11" is input for the state S0, status transition occurs to the status S2, as "100" is output.

The encoder, applied to the magnetic recording and/or reproducing apparatus, shown as the second embodiment, iterates the status transition for encoding, in accordance with the trellis formed by the above-described sequence of operations, to generate a modulated code string having correlation between input data. The encoder may be provided with components shown for example in FIG. 16.

Figure 16:
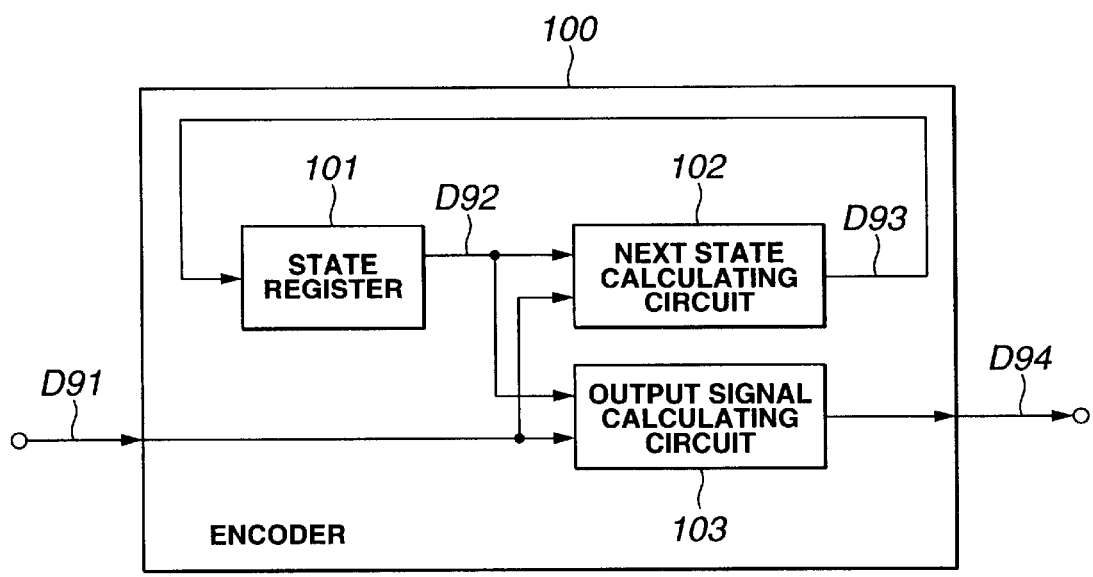
FIG. 16 is a block diagram showing the structure of an encoder used in a recording system of a magnetic recording and/or reproducing apparatus shown as a second embodiment of the present invention.

The encoder 100, shown in FIG. 16, includes a state register 101 for holding the state of the encoder 100, a next-state calculating circuit 102, for calculating the next transition state, and an output signal calculating circuit 103 for calculating an output signal D94.

The state register 101 is a 2-bit register holding 2 bits specifying the state of the current encoder 100. The state register 101 sends a status signal D92, specifying the 2 bits indicating the current state, to the next-state calculating circuit 102 and to the output signal calculating circuit 103, as the state register 91 holds 2 bits indicating the next state corresponding to the next state signal D93 supplied from the next-state calculating circuit 102.

When fed with the input signal D91 and with the status signal D92, supplied from the state register 101, the next-state calculating circuit 102 calculates the next state in accordance with the following input/output correlating table 4:

TABLE 4

Typical Input/Output Correlating Table

| status signals | input signals | next-state signals |
|---|---|---|
| 0 | 00 | 0 |
| 0 | 01 | 1 |
| 0 | 10 | 1 |
| 0 | 11 | 2 |
| 1 | 00 | 1 |
| 1 | 01 | 0 |
| 1 | 10 | 0 |
| 1 | 11 | 2 |
| 2 | 00 | 2 |
| 2 | 01 | 0 |
| 2 | 10 | 0 |
| 2 | 11 | 1 |
| 3 | 00 | 0 |
| 3 | 01 | 0 |
| 3 | 10 | 0 |
| 3 | 11 | 0 |

The next state calculating circuit 102 routes the next state signal D93, specifying the next state, to the state register 101.

If fed with the input signal D91 and with the status signal D92, supplied from the state register 101, the output signal calculating circuit 103 calculates an output signal D94, in accordance with the following input/output correlating table 5:

TABLE 5

Typical Input/Output Correlating Table

| status signals | input signals | output signals |
|---|---|---|
| 0 | 00 | 111 |
| 0 | 01 | 110 |
| 0 | 10 | 010 |
| 0 | 11 | 100 |
| 1 | 00 | 110 |
| 1 | 01 | 011 |
| 1 | 10 | 111 |
| 1 | 11 | 100 |
| 2 | 00 | 100 |
| 2 | 01 | 101 |
| 2 | 10 | 111 |
| 2 | 11 | 110 |
| 3 | 00 | 111 |
| 3 | 01 | 111 |
| 3 | 10 | 111 |
| 3 | 11 | 111 |

Meanwhile, this output signal D94 satisfies the (d, k)=(0, 2) limitations.

When fed with the input signal D91, the encoder 100 calculates the next state, using this input signal D91 and the status signal D92, by the next-state calculating circuit 102, for storage sequentially in the state register 101. The encoder 100 calculates an output signal D94, by the output signal calculating circuit 103, using the input signal D91 and the status signal D92, by the output signal calculating circuit 103, to output the so-calculated output signal D94 to outside.

Since there lacks the status S3 in the encoder 100, if transition to the status S3 occurs before the resetting of the encoder 100, "111" is instantly output as an output signal D94, based on the Table 5, to realize the function of resetting to the state S0.

A decoder for decoding the signal, encoded by the above-described encoder, applies the decoding, which is based on the BCJR or SOVA algorithm, in accordance with the trellis previously explained with reference to FIG. 15. With this decoder, the magnetic recording and/or reproducing apparatus is able to perform trellis decoding exploiting the signal correlation in the modulation encoder.

In particular, if, in performing trellis decoding in the magnetic recording and/or reproducing apparatus, SISO decoding of the BCJR or SOVA algorithm is used in the decoder, so that decoding can be performed using the soft information, thereby improving the decoding error rate.

The magnetic recording and/or reproducing apparatus, employing this type of the interleaver, encoder and the decoder, is hereinafter explained with reference to FIG. 17.

Figure 17:
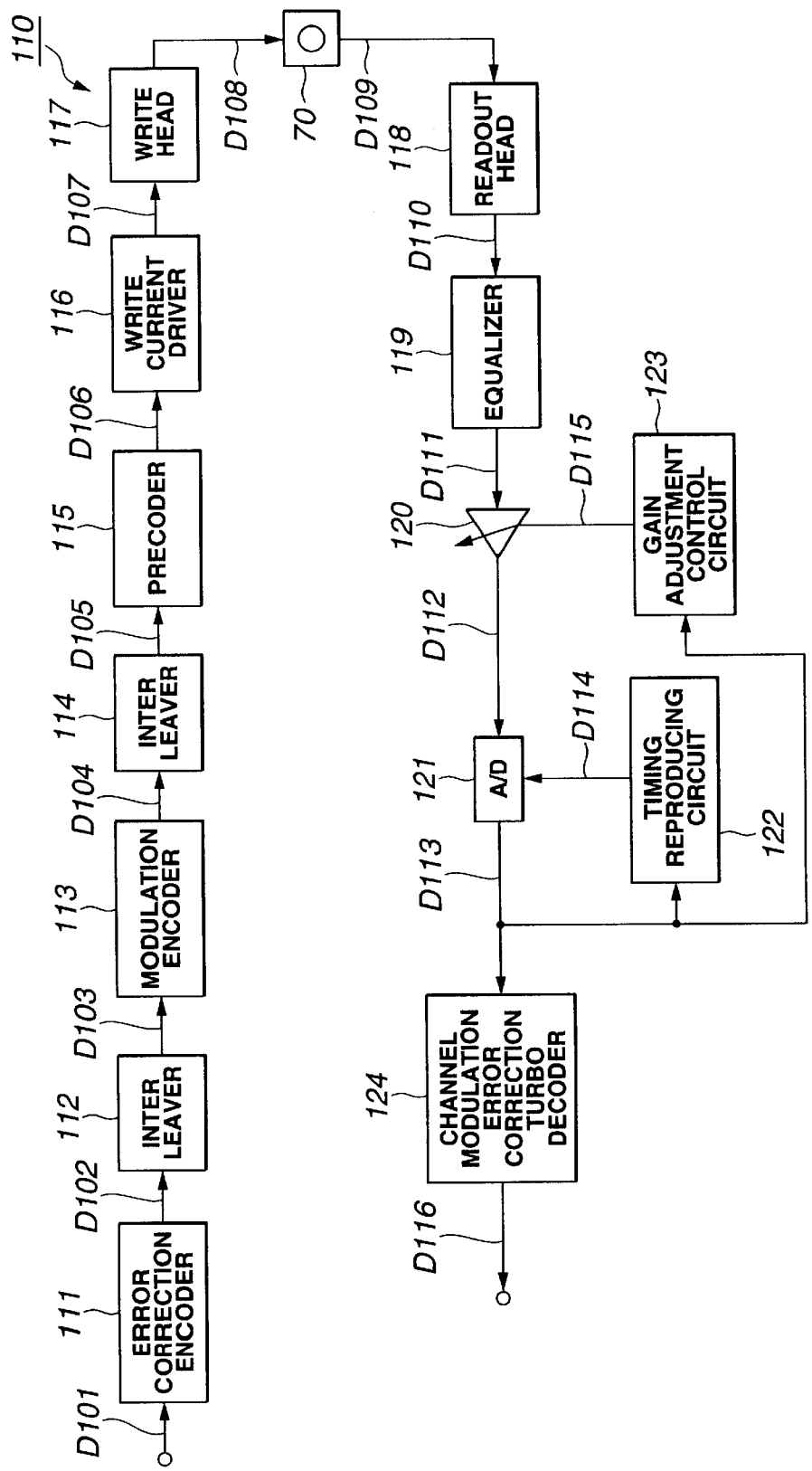
FIG. 17 is a block diagram for illustrating the structure of the magnetic recording and/or reproducing apparatus.

The magnetic recording and/or reproducing apparatus 110, shown in FIG. 17, includes, as a recording system for recording data on a recording medium 70, an error correction encoder 111 for error correction encoding input data, interleavers 112, 114 for re-arraying the sequence of input data, a modulation encoder 113 for modulation encoding input data, a precoder 115 for filtering input data for compensating its channel characteristics, a write current driver 116 for converting respective bits of the input data into write current values, and a write head 117 for recording data on the recording medium 70.

Similarly to the error correction coder 51 in the magnetic recording and/or reproducing apparatus 50, the error correction encoder 111, as the error correction encoding means, applies error correction coding to the input data D101. The error correction encoder 111 routes the error correction encoded data D102, generated after error correction encoding, to the downstream side interleaver 112.

Similarly to the interleaver 52, as the first interleaving means, the interleaver 112, as first interleaving means, interleaves the error correction encoded data D102, encoded by the error correction encoder 111, on the bit basis, to re-array the sequence of the respective bits making up the error correction encoded data D102. The interleaver 112 routes the generated interleaved data D103 to the downstream side modulation encoder 113.

The modulation encoder 113, as modulation encoding means, is configured as the aforementioned encoder 100, and is a modulation encoder performing the encoding by repeating status transitions in accordance with the trellis to generate a modulated codestring exhibiting correlation between input data. The modulation encoder 113 applies pre-set trellis modulation encoding to the interleaved data D103, supplied from the interleaver 112, to generate modulation encoded data D104 as a sequence subjected to limitations. The modulation encoder 113 routes the generated modulation encoded data D103 to the downstream side interleaver 114.

The interleaver 114, as second interleaving means, interleaves the modulation encoded data D104, encoded with block modulation by the modulation encoder 113, in a pre-set unit, for example, in terms of a trellis modulation encoding block as a unit, to re-array the sequence of respective bits making up the modulation encoded data D104. The Interleaver 114 sends the generated interleaved data D105, to the downstream side precoder 115.

Similarly to the precoder 55 in the above-described magnetic recording and/or reproducing apparatus 50, the precoder 115 as the precoding means filters the interleaved data D105, supplied from the interleaver 114, such as to compensate for channel characteristics from the data writing on the recording medium 70 up to outputting in the equalizer 119 in the reproducing system, to generate a precode signal D106 as a binary signal. The precoder 115 routes the so-generated precoder signal D106 to the downstream side write current driver 116.

Similarly to the write current driver 56 in the aforementioned magnetic recording and/or reproducing apparatus 50, the write current driver 116 converts respective bits of the precode signal D106, supplied from the precoder 115, into the write current value $I_s$, to generate a write current signal D107. The write current driver 116 sends the generated write current signal D107 to a downstream side write head 117.

Similarly to the write head 57 in the aforementioned magnetic recording and/or reproducing apparatus 50, the write head 117 applies a magnetic write signal D108, corresponding to the write current signal D107 supplied from the write current driver 116, to the recording medium 70, to record data thereon.

In recording data on the recording medium 70, the recording system in the magnetic recording and/or reproducing apparatus 110 error correction encodes the input data D101 by the error correction encoder 111. The recording system then interleaves the error correction encoded data D102 on the bit basis by the interleaver 112 and subsequently applies the pre-set trellis modulation encoding by the modulation encoder 113 to the interleaved data D103. The recording system then interleaves the modulation encoded data D104 by the interleaver 114 based on the modulation encoding block of the trellis, to generate a precede signal D106 by the precoder 115.

The recording system records the precode signal D106, generated by the precoder 115, on the recording medium 70, by the write current driver 116 and the write head 117.

The recording system of the magnetic recording and/or reproducing apparatus 110, thus having the interleaver 112 downstream of the error correction encoder 111 and also having the interleaver 114 downstream of the modulation encoder 113, effects encoding by serial concatenated coding between the error correction encoder 111, modulation encoder 113 and the precoder 115 to realize high performance coding as error correction encoding, modulation encoding and channel coding.

As the reproducing system for reproducing data recorded on the recording medium 70, the magnetic recording and/or reproducing apparatus 110 includes a readout head 118 for reading out data recorded on the recording medium 70, an equalizer 119 for equalizing input data, a gain adjustment circuit 120 for adjusting the gain of the input data, an analog/digital converter 121 for converting analog data to digital data, a timing reproducing circuit 122 for reproducing clocks, a gain adjustment control circuit 123 for controlling the gain adjustment circuit 120, and a channel, modulation and error correction turbo decoder 124 for turbo decoding the input data.

Similarly to the readout head 57 of the magnetic recording and/or reproducing apparatus 50, a readout head 118 reads out the readout magnetic signal D108 from the recording medium 70 to generate a readout current signal D109 conforming to the readout magnetic signal D109. The readout head 118 sends the so-generated current signal D110 to the downstream side equalizer 119.

Similarly to the equalizer 59 of the magnetic recording and/or reproducing apparatus 50, the equalizer 119 equalizes the readout current signal D110, supplied from the readout head 118, so that the channel response from the data writing on the recording medium 70 in the recording system up to the outputting at the equalizer 119 will be of pre-set characteristics, to generate an equalized signal D111. The equalizer 119 routes the generated equalized signal D111 to the downstream side gain adjustment circuit 120.

Similarly to the gain adjustment circuit 60 of the magnetic recording and/or reproducing apparatus 50, the gain adjustment circuit 120 adjusts the gain of the equalized signal D111 supplied from the equalizer 119, based on a gain adjustment control signal D115, supplied from the gain adjustment control circuit 123, to generate a gain adjustment signal D112. The gain adjustment circuit 109 routes the generated gain adjustment signal D112 to the downstream side A/D converter 121.

Similarly to the A/D converter 61 of the magnetic recording and/or reproducing apparatus 50, the A/D converter 121 samples and digitizes the gain adjustment signal D112, supplied from the gain adjustment circuit 120, based on the clock signal D114, supplied from the timing regenerating circuit 122, to generate a digital channel signal D112. The A/D converter 121 sends the generated digital channel signal D113 to the timing regenerating circuit 122, gain adjustment control circuit 123 and to the channel and modulation turbo decoder 124.

Similarly to the timing generating circuit 62 of the magnetic recording and/or reproducing apparatus 50, the timing regenerating circuit 122 regenerates clocks from the digital channel signal D113 supplied from the A/D converter 121 to generate clock signals D113. The timing regenerating circuit 122 sends the generated clock signals D114 to the A/D converter 121.

Similarly to the gain adjustment control circuit 63 of the magnetic recording and/or reproducing apparatus 50, the gain adjustment control circuit 123 generates, based on the digital channel signal D113, supplied from the A/D converter 121, a gain adjustment control signal D115, which is a control signal used for maintaining the amplitude of the equalized signal D111 at an expected value. The gain adjustment control circuit 123 sends the generated gain adjustment control signal D115 to the gain adjustment circuit 120.

Similarly to the channel, modulation and error correction turbo decoder 64 of the magnetic recording and/or reproducing apparatus 50, the channel, modulation and error correcting turbo decoder 124, is comprised of concatenated SISO decoders to effect turbo decoding. The channel, modulation and error correction turbo decoder 124 turbo-decodes the input digital channel signal D113 from the A/D converter 121 to output the decoded result to outside as soft or hard output data D116, as will be explained subsequently in detail.

Figure 18:
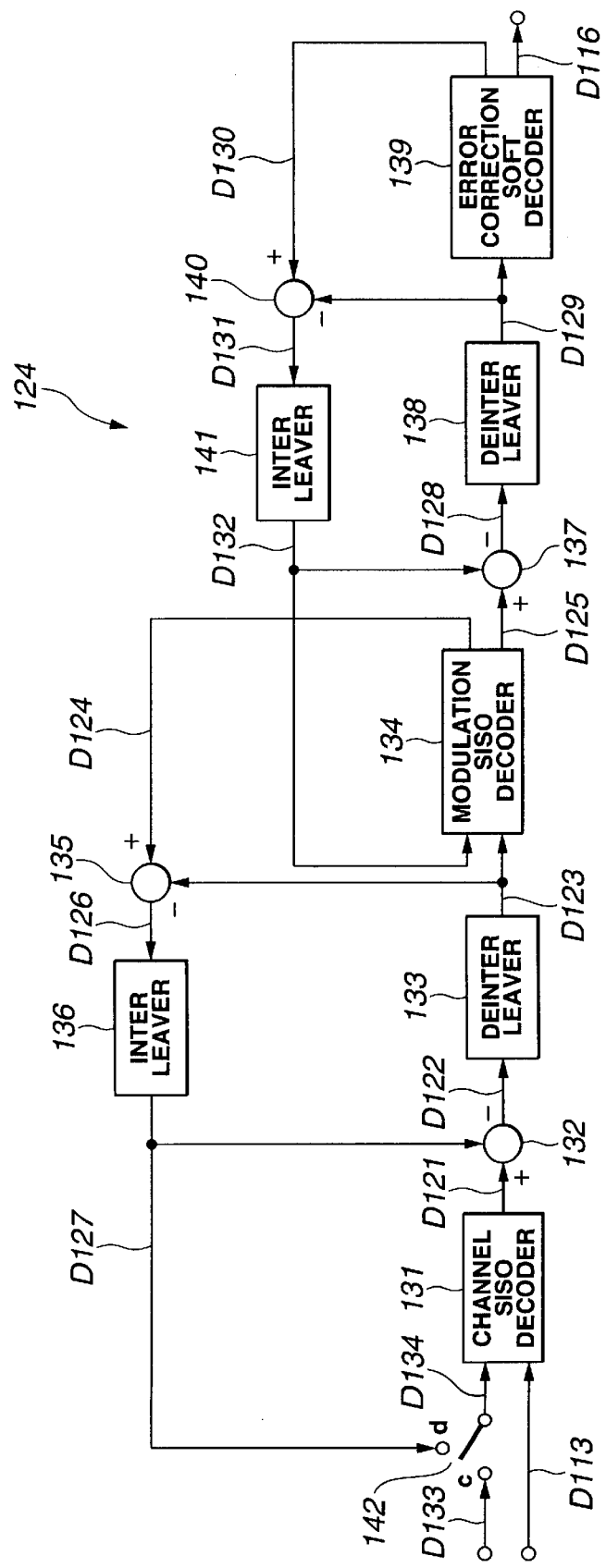
FIG. 18 is a block diagram for illustrating the structure of the channel and a modulation and error correction turbo decoder provided in a reproducing system of the magnetic recording and/or reproducing apparatus.

Referring to FIG. 18, the channel, modulation and error correcting turbo decoder 124 is explained.

In this figure, the channel, modulation and error correcting turbo decoder 124 includes a channel SISO decoder 131, as an SISO decoder for decoding the channel response from the pre-stage of the precoder 115 in the recording system to the outputting in the equalizer 119 in the reproducing system, deinterleavers 133, 138 for restoring the sequence of the input data to the original sequence, a modulation SISO decoder 134, as a SISO decoder for modulation decoding the input data, interleavers 136, 141 for re-arraying the sequence of the input data, an error correction soft decoder 139 for error correction soft decoding the input data, a changeover switch 142 for changing over data to be input as the priori probability information for an information bit and four difference talking units 132, 135, 137, 140.

The channel SISO decoder 131, as channel decoding means, is fed with the digital channel signal D113, as a soft input supplied from the A/D converter 121, and with priori probability information D134, as selected by the changeover switch 142 from the priori probability information D127 for information bits supplied as soft input from the interleaver 136 or the priori probability information D133 for information bits having a value of "0", to effect soft output decoding, based on the BCJR algorithm or SOVA, in accordance with the trellis for the channel response from the pre-stage of the precoder 115 in the recording system to an output in the equalizer 119 in the reproducing system. If the interleaved data D105 prior to precoding by the precoder 115 is expressed as C(t) (0≦t≦N), the channel SISO decoder 131 calculates the log posterior probability ratio log(P(C(t)=1)/ P(C(t)=0)), as the posterior probability information for this C(t), to send this log posterior probability ratio as the channel decoded signal D121 to the downstream side difference taking unit 132.

The difference taking unit 132 finds a difference between the channel decoded signal D121, as soft input, supplied from the channel SISO decoder 131, and the priori probability information D127, as soft input, supplied from the interleaver 136, to output data corresponding to this difference value as soft output to the downstream side deinterleaver 133 as the channel extrinsic information signals D122 as the extrinsic information for an information bit as found by the code constraint condition. Meanwhile, the channel extrinsic information signals D122 corresponds to the interleaved data D105 obtained on interleaving by the interleaver 114 in the recording system.

The deinterleaver 133, as first deinterleaving means, deinterleaves the soft-input channel extrinsic information signals D122 supplied from the difference taking unit 132 in a pre-set unit, for example, based on a modulation encoding block as a unit, in order to restore the bit sequence of the interleaved data D105 from the interleaver 114 in the recording system to that of the original modulation encoded data D104. The deinterleaver 133 sends the deinterleaved data to the modulation SISO decoder 134 and to the difference taking unit 135 as the deinterleaved signal D123 which is the priori probability information for the code bits in the modulation SISO decoder 134.

The modulation SISO decoder 134, as modulation decoding means, decodes signals encoded by the modulation encoder 113 in the recording system, and is an SISO type modulation decoder. The modulation encoded data D104, obtained on modulation encoding by the modulation encoder 113 with a code rate R=K/N, is specified as M(t) (0≦t<N) and the error correction encoded data D104 prior to modulation encoding by the modulation encoder 113 is specified as E(t) (0≦t<L). The modulation SISO decoder 134 is fed with the deinterleaved signal D123, supplied as soft input from the deinterleaver 133, and calculates the log posterior probability ratio log(P(M(t)=1)/P(M(t)=0)), as posterior probability information for M(t), and the log posterior probability ratio log(P(E(t)=1)/P(E(t)=0)), as posterior probability information for E(t), using the trellis corresponding to the constraint condition. The modulation SISO decoder 134 then sends the so-calculated log posterior probability ratio as the posterior probability information for M(t) as the modulation channel decoded signal D124 to the difference taking unit 135, while sending the calculated log posterior probability ratio as the posterior probability information for E(t) as the modulation decoded signal D125 to the difference taking unit 137.

The difference taking unit 135 finds a difference between the modulation channel decoded signal D124, supplied as soft input from the modulation SISO decoder 134, and the deinterleaved signal D123, supplied as soft input from the deinterleaver 133, to output the data as the difference value as soft output to the downstream side interleaver 136 as the modulation error correction extrinsic information signals D126, which is the extrinsic information for a code bit as found by the code constraint condition.

The interleaver 136, as third interleaving means, interleaves the modulation error correction extrinsic information signals D126, supplied from the difference taking unit 135, in a pre-set unit which is based on the same interleaving position information as that of the interleaver 114 of the recording system, such as on the modulation encoding block basis. The interleaver 136 sends the interleaved data to the channel SISO decoder 131 and to the difference taking unit 132 as being the priori probability information signal D127 for the information bit in the channel SISO decoder 131.

The difference taking unit 137 finds a difference between the modulation decoded signal D125, supplied as soft input from the modulation SISO decoder 134, and the deinterleaved signal D132, supplied as soft input from the deinterleaver 141, to output the data as the difference value as soft output to the downstream side interleaver 138 as soft output as being the modulation extrinsic information signal D128 for an information bit as found by the code constraint condition. Meanwhile, the modulation extrinsic information signal D128 corresponds to the interleaved data D103 obtained by the interleaver 112 in the recording system.

The deinterleaver 138, as second deinterleaving means, deinterleaves the soft-input channel extrinsic information signals D128, supplied from the difference taking unit 137, on the bit basis, in order to restore the bit sequence of the interleaved data D103 from the interleaver 112 in the recording system to that of the original error correction encoded data D102. The deinterleaver 138 sends the deinterleaved data to the error correction soft decoder 139 and to the difference taking unit 140 as the deinterleaved signal D129 which is the priori probability information for the code bits in the error correction soft decoder 139.

The error correction soft decoder 139, as error correction decoding means, soft-decodes the error correction code of the deinterleaved signal D129, supplied from the deinterleaver 138, based on the aforementioned BCJR algorithm or on the SOVA. Assume that the error correction encoded data D102 following error correction encoding by the error correction encoder 111 of the recording system and the input data prior to error correction encoding by the error correction encoder 111 are expressed as $E(t)$ ($0 \leq t < L$) and $I(t)$ ($0 \leq t < K$), respectively. The error correction soft decoder 139 calculates the log posterior probability ratio $\log(P(E(t)=1)/P(E(t)=0))$, as the posterior probability information for $E(t)$, and routes this log posterior probability ratio as the posterior probability information D130 to the difference taking unit 140, while calculating the log posterior probability ratio $\log(P(I(t)=1)/P(I(t)=0))$, as the posterior probability information for $I(t)$, and outputting the decoded result corresponding to this log posterior probability ratio to outside as the soft or hard output data D116.

The difference taking unit 140 finds a difference between the error correction decoded signal D130, supplied as soft input from the error correction soft decoder 139, and the deinterleaved signal D129, supplied as soft input from the deinterleaver 138, to output the data as the difference value as soft output to the downstream side interleaver 141 as soft output as being the error correction extrinsic information signal D131 which is the extrinsic information for a code bit as found by the code constraint condition.

The interleaver 141, as fourth interleaving means, interleaves the soft-input error correction extrinsic information signals D131, supplied from the difference taking unit 140, on the bit basis. The interleaver 141 sends the interleaved data to the modulation SISO decoder 134 and to the difference taking unit 137 as the interleaved signal D132 which is the priori probability information for the information bit in the modulation SISO decoder 134.

In the initial stage of the decoding, the changeover switch 142 is set to the fixed terminal c supplying a value 0 corresponding to the priori probability information signal D133 to select the priori probability information signal D133 as being the priori probability information signal D134 for an information bit in the channel SISO decoder 131. The changeover switch 142 then is set to a fixed terminal d supplying the priori probability information signal D127 supplied from the interleaver 136 to select the priori probability information signal D127 as being the priori probability information signal D134.

Similarly to the channel, modulation and error correction turbo decoder 64 in the previously described magnetic recording and/or reproducing apparatus, the channel, modulation and error correcting turbo decoder 124 is provided with the error correction soft decoder 139, modulation SISO decoder 134 and with the channel SISO decoder 131, as counterparts to the error correction encoder 111, modulation coder 113 and the precoder 115 of the recording system, respectively, to decompose the code of high decoding complexity into elements with lower decoding complexity, such as to sequentially improve characteristics by the interaction between the channel SISO decoder 131, modulation SISO decoder 134 and the error correction soft decoder 139. If fed with the digital channel signal D113, as a soft input, from the A/D converter 121, the channel, modulation and error correcting turbo decoder 124 iterates the decoding operation from the channel SISO decoder 131 to the error correction soft decoder 139 a pre-set number of times, such as several to tens of times, to route the soft-output log posterior probability ratio, obtained on decoding the pre-set number of times, as soft output data D116 directly to outside. Alternatively, the channel, modulation and error correcting turbo decoder 124 binary-codes the soft output log posterior probability ratio by a binary-coding circuit, not shown, to output the resulting binary data to outside as the hard output data D116.

In reproducing data recorded on the recording medium 70, the reproducing system of the magnetic recording and/or reproducing apparatus 110 turbo-decodes the soft-input digital channel signal D113, generated through the readout head 118, equalizer 119, gain adjustment circuit 120 and the A/D converter 121, by the channel, modulation and error correcting turbo decoder 124, to generate an output data D116 corresponding to the input data D101 input to the error correction coder 111 in the recording system.

The reproducing system of the magnetic recording and/or reproducing apparatus 110 is provided in this manner with the channel, modulation and error correcting turbo decoder 124 and performs turbo decoding between the error correction soft decoder 139, modulation SISO decoder 134 and with the channel SISO decoder 131, as counterparts to the error correction encoder 111, modulation coder 113 and the precoder 115 of the recording system, respectively, to realize decoding in meeting with the channel response, modulation encoding and error correction coding.

The magnetic recording and/or reproducing apparatus 110 includes, in its recording system, the interleaver 112 downstream of the error correction encoder 111 and the interleaver 114 downstream of the modulation coder 113, to effect encoding by serial concatenated code between the error correction encoder 111, modulation coder 113 and the precoder 115, while including, on its reproducing side, the channel, modulation and error correcting turbo decoder 124 to effect turbo decoding to realize high performance coding as well as highly efficient turbo decoding exploiting the soft information for the entire decoding processing for the code. Since there is no necessity of diminishing the information, the decoding error rate can be lowered significantly. Moreover, the magnetic recording and/or reproducing apparatus 110 effects coding in the recording system, as correlation is afforded to the fore and aft side data. In addition, trellis decoding can be performed on the reproducing side in meeting with the constraint condition, thus further lowering the decoding error rate.

The above-described magnetic recording and/or reproducing apparatus 50, 110 are able to perform efficient turbo decoding by exploiting the soft information, thereby lowering the decoding error rate. In particular, with the magnetic recording and/or reproducing apparatus 110, encoding can be made as correlation is afforded to the fore and aft side data, without doing block-based encoding or decoding, while trellis decoding can be made in meeting with the constraint conditions, thus further lowering the decoding error rate. That is, the magnetic recording and/or reproducing apparatus 50, 110 is able to realize high precision decoding, thus assuring high operational reliability fort the user.

The present invention is not limited to the above-described embodiment. For example, the present invention may be applied to a recording medium 70 other than the recording medium of the magnetic recording system, that is to a recording medium by the optical recording system, such as a so-called CD (Compact Disc) or to the DVD (Digital Versatile Disc) or to a recording medium of the photomagnetic recording system, such as a so-called magneto-optical disc (MO) disc.

In the above-described embodiment, it is assumed that the magnetic recording and/or reproducing apparatus 110 performs trellis modulation encoding on the encoder side and trellis modulation decoding on the decoder side. However, the present invention is applicable to such a case wherein the trellis modulation decoding is performed on the decoder side to output a soft decision value even in case the trellis modulation encoding is not performed on the encoding side, as when block modulation is effected on the encoder side.

Moreover, in the above-described embodiment, it is assumed that the magnetic recording and/or reproducing apparatus 50 or 110 is a unitary apparatus provided with the recording and reproducing systems. Alternatively, a unitary recording apparatus may be configured as a recording system for recording data on a recording medium, while a unitary reproducing apparatus may also be configured as a reproducing system for reproducing the data recorded on the recording apparatus.

In the foregoing, the present invention has been disclosed only by way of illustration and should not be interpreted in a limiting fashion. The scope of the present invention is to be interpreted in light of the description of the following claims.

What is claimed is:

1. A data recording apparatus for recording data on a recording medium, comprising:
   error correction encoding means for error correction encoding input data;
   first interleaving means for interleaving the data supplied from said error correction encoding means for re-arraying the sequence thereof;
   modulation encoding means for applying predetermined modulation encoding on the data supplied from said first interleaving means; and
   second interleaving means for interleaving the data supplied from said modulation encoding means for re-arraying the sequence thereof.

2. The data recording apparatus according to claim 1 further comprising:
   precoding means for filtering the data supplied from said second interleaving means such as to compensate channel characteristics thereof.

3. The data recording apparatus according to claim 1 wherein said first interleaving means interleaves the data encoded by said error correction encoding means on the bit basis.

4. The data recording apparatus according to claim 1 wherein said modulation encoding means encodes the data supplied from said first interleaving means in accordance with a constraint condition.

5. The data recording apparatus according to claim 4 wherein said second interleaving means interleaves data encoded by said modulation encoding means such as to satisfy said constraint condition.

6. The data recording apparatus according to claim 4 wherein said modulation encoding means encodes data supplied from said first interleaving means by block modulation.

7. The data recording apparatus according to claim 6 wherein said second interleaving means interleaves the data encoded by block modulation by said modulation encoder means in terms of a modulation encoding block as a unit.

8. The data recording apparatus according to claim 4 wherein said modulation encoding means encodes data supplied from said first interleaving means in accordance with a trellis corresponding to said constraint condition.

9. The data recording apparatus according to claim 8 wherein said second interleaving means interleaves data encoded by said modulation encoding means in terms of a modulation encoding block of said trellis as a unit.

10. The data recording apparatus according to claim 1 wherein said recording medium has data recorded thereon in a magnetic, optical or magneto-optical system.

11. A data recording method for recording data on a recording medium, comprising the steps of:
    error correction encoding input data;
    first interleaving the data supplied from said error correction encoding step for re-arraying the sequence thereof;
    modulation encoding on the data supplied from said first interleaving step; and
    second interleaving the data supplied from said modulation encoding step for re-arraying the sequence thereof.

12. The data recording method according to claim 11 further comprising:
    filtering the data supplied from said second interleaving step such as to compensate channel characteristics thereof.

13. The data recording method according to claim 11 wherein said first interleaving step interleaves the data encoded by said error correction encoding step on the bit basis.

14. The data recording method according to claim 11 wherein said modulation encoding step encodes the data supplied from said first interleaving step in accordance with a constraint condition.

15. The data recording method according to claim 14 wherein said second interleaving step interleaves data encoded by said modulation encoding step such as to satisfy said constraint condition.

16. The data recording method according to claim 14 wherein said modulation encoding step encodes data re-arrayed in said first interleaving step by block modulation.

17. The data recording method according to claim 16 wherein said second interleaving step interleaves the data encoded by block modulation in said second interleaving step in terms of a modulation encoding block as a unit.

18. The data recording method according to claim 14 wherein said modulation encoding step encodes data supplied from said first interleaving step in accordance with a trellis corresponding to said constraint condition.

19. The data recording method according to claim 18 wherein said second interleaving step interleaves data encoded in said modulation encoding step in terms of a modulation encoding block of said trellis as a unit.

20. The data recording method according to claim 11 wherein said recording medium has data recorded thereon in a magnetic, optical or magneto-optical system.

21. A data reproducing apparatus for reproducing data recorded by a recording equipment for recording data on a recording medium including error correction encoding means for error correction encoding input data, first interleaving means for interleaving the data supplied from said error correction encoding means for re-arraying the sequence thereof, modulation encoding means for applying predetermined modulation encoding on the data supplied from said first interleaving means and second interleaving means for interleaving the data supplied from said modulation encoding means for re-arraying the sequence thereof; said data reproducing apparatus comprising:
    first deinterleaving means for interleaving input data for re-arraying the sequence thereof, in order to restore a bit sequence of data re-arrayed by said second interleaving means to a bit sequence of data encoded by said modulation encoding means;

modulation decoding means for modulation decoding data supplied from said first deinterleaving means;

third interleaving means for interleaving data given as a difference between data output from said modulation decoding means and data output from said first deinterleaving means, based on the same interleaving position information as that for said second interleaving means;

second deinterleaving means for interleaving the input data for re-arraying the sequence thereof, in order to restore a bit sequence of data re-arrayed by said first interleaving means to a bit sequence of data encoded by said error correction encoding means;

error correction decoding means for decoding the error correction code of data supplied from said second deinterleaving means; and fourth interleaving means for interleaving data given by a difference between data output from said error correction decoding means and data output from said second deinterleaving means, based on the same interleaving position information as that for said first interleaving means, for re-arraying the sequence thereof.

22. The data reproducing apparatus according to claim 21 wherein said recording equipment includes precode means for filtering data supplied from said second interleaving means such as to compensate for channel characteristics thereof, and channel decoding means for decoding channel response.

23. The data reproducing apparatus according to claim 22 wherein said channel decoding means is fed with a soft input signal and performs soft output decoding.

24. The data reproducing apparatus according to claim 23 wherein said first deinterleaving means interleaves data given by a difference between data decoded by said channel decoding means and data re-arrayed by said third interleaving means;

said second deinterleaving means interleaves data given as a difference between data decoded by said modulation decoding means and data re-arrayed by said fourth interleaving means;

iterative decoding being made between said error correction decoding means, modulation decoding means and said channel decoding means.

25. The data reproducing apparatus according to claim 22 wherein said channel decoding means is fed with a soft input signal and performs soft output decoding based on a trellis corresponding to channel response.

26. The data reproducing apparatus according to claim 21 wherein said modulation decoding means is fed with a soft input signal and issues a soft output signal.

27. The data reproducing apparatus according to claim 26 wherein said modulation decoding means performs soft output decoding based on the BCJR or SOVA algorithm.

28. The data reproducing apparatus according to claim 21 wherein said modulation encoding means encodes data supplied from said first interleaving means in accordance with a constraint condition; and wherein said modulation decoding means performs decoding in accordance with said constraint condition.

29. The data reproducing apparatus according to claim 28 wherein said second interleaving means interleaves the data encoded by said modulation encoding means such as to satisfy said constraint condition.

30. The data reproducing apparatus according to claim 28 wherein said modulation encoding means encodes the data supplied from said first interleaving means by block modulation.

31. The data reproducing apparatus according to claim 30 wherein said modulation decoding means includes likelihood calculating means for calculating a likelihood value corresponding to each output codeword issued from said modulation encoding means, and wherein said modulation decoding means finds the posterior probability information as a soft decision value for an input bit fed to said modulation encoding means and an output bit issued from said modulation encoding means, based on the likelihood value.

32. The data reproducing apparatus according to claim 30 wherein said modulation decoding means performs decoding based on a trellis corresponding to said constraint condition.

33. The data reproducing apparatus according to claim 30 wherein said second interleaving means interleaves data encoded by block modulation by said modulation encoding means in terms of a modulation encoding block as a unit;

said first deinterleaving means interleaves the input data in terms of said modulation encoding block as a unit; and wherein said third interleaving means interleaves data given as a difference between data output from said modulation decoding means and data output from said first deinterleaving means in terms of the modulation encoding block as a unit.

34. The data reproducing apparatus according to claim 28 wherein said modulation encoding means encodes data supplied from said first interleaving means in accordance with a trellis corresponding to said constraint condition;

said modulation decoding means performing decoding based on said trellis corresponding to said constraint condition.

35. The data reproducing apparatus according to claim 34 wherein said second interleaving means interleaves data encoded by said modulation encoding means in terms of a modulation encoding block of said trellis as a unit;

said first deinterleaving means interleaves the input data in terms of the modulation encoding block of said trellis as a unit; and wherein said third interleaving means interleaves data given as a difference between data output from said modulation decoding means and data output from said first deinterleaving means in terms of the modulation encoding block of said trellis as a unit.

36. The data reproducing apparatus according to claim 21 wherein said error correction decoding means is fed with a soft input signal and soft-decodes an error correction code of the input soft input signal.

37. The data reproducing apparatus according to claim 21 wherein said first interleaving means interleaves data encoded by said error correction encoding means on the bit basis;

said second deinterleaving means interleaves the input data on the bit basis; and wherein said fourth interleaving means interleaves data given as a difference between data output from said error correction decoding means and data output from said second deinterleaving means on the bit basis.

38. The data reproducing apparatus according to claim 21 wherein said recording medium has data recorded thereon in a magnetic, optical or magneto-optical system.

39. A data reproducing method for reproducing data recorded by a recording method for recording data on a recording medium including an error correction encoding step of error correction encoding input data, a first interleaving step of interleaving the data supplied from said error correction encoding step of re-arraying the sequence thereof, a modulation encoding step of applying predetermined modulation encoding on the data supplied from said first interleaving step and a second interleaving step of interleaving the data supplied from said modulation encoding step of re-arraying the sequence thereof; said data reproducing method comprising the steps of:

first deinterleaving input data for re-arraying the sequence thereof, in order to restore a bit sequence of data re-arrayed by said second interleaving step to a bit sequence of data encoded by said modulation encoding step;

modulation decoding data supplied from said first deinterleaving step;

third interleaving data given as a difference between data output from said modulation decoding step and data output from said first deinterleaving step, based on the same interleaving position information as that for said second interleaving step;

second deinterleaving the input data for re-arraying the sequence thereof, in order to restore a bit sequence of data re-arrayed by said first interleaving step to a bit sequence of data encoded by said error correction encoding step;

decoding the error correction code of data supplied from said second deinterleaving step; and fourth interleaving data given by a difference between data decoded in said error correction decoding step and data re-arrayed in said second deinterleaving step, based on the same interleaving position information as that for said first interleaving step, for re-arraying the sequence thereof.

40. The data reproducing method according to claim 39 wherein said recording method includes a precode step of filtering data re-arrayed in said second interleaving step such as to compensate for channel characteristics thereof, the data reproducing method further comprising:

decoding channel response.

41. The data reproducing method according to claim 40 wherein said step of decoding channel response is fed with a soft input signal and performs soft output decoding.

42. The data reproducing method according to claim 41 wherein said first deinterleaving step interleaves data given by a difference between data decoded in said step of decoding channel response and data re-arrayed in said third interleaving step for re-arraying the sequence of said difference data;

said second deinterleaving step interleaves data given as a difference between data decoded by said modulation decoding step and data re-arrayed by said fourth interleaving step for re-arraying the sequence of said difference data;

iterative decoding being made between said error correction decoding step, modulation decoding step and said step of decoding channel response.

43. The data reproducing method according to claim 40 wherein said step of decoding channel response is fed with a soft input signal and performs soft output decoding based on a trellis corresponding to channel response.

44. The data reproducing method according to claim 39 wherein said modulation decoding step is fed with a soft input signal and issues a soft output signal.

45. The data reproducing method according to claim 44 wherein said modulation decoding step performs soft output decoding based on the BCJR or SOVA algorithm.

46. The data reproducing method according to claim 39 wherein said modulation encoding step encodes data supplied from said first interleaving step in accordance with a constraint condition; and wherein said modulation decoding step performs decoding in accordance with said constraint condition.

47. The data reproducing method according to claim 46 wherein said second interleaving step interleaves the data encoded by said modulation encoding step such as to satisfy said constraint condition.

48. The data reproducing method according to claim 46 wherein said modulation encoding step encodes the data supplied from said first interleaving step by block modulation.

49. The data reproducing method according to claim 48 wherein said modulation decoding step includes a likelihood calculating step of calculating a likelihood value corresponding to each output codeword generated in and issuing from said modulation encoding step; and wherein said modulation decoding step finds the posterior probability information as a soft decision value for an input bit fed to said modulation encoding step and an output bit generated by and issuing from said modulation encoding step based on the likelihood value.

50. The data reproducing method according to claim 48 wherein said modulation decoding step performs decoding based on a trellis corresponding to said constraint condition.

51. The data reproducing method according to claim 48 wherein said second interleaving step interleaves data encoded by block modulation by said modulation encoding step in terms of a modulation encoding block as a unit;

said first deinterleaving step interleaves the input data in terms of said modulation encoding block as a unit; and wherein said third interleaving step interleaves data given as a difference between data output from said modulation decoding step and data re-arrayed in said first deinterleaving step in terms of the modulation encoding block as a unit.

52. The data reproducing method according to claim 46 wherein said modulation encoding step encodes data re-arrayed in said first interleaving step in accordance with a trellis corresponding to said constraint condition;

said modulation decoding step performing decoding based on said trellis corresponding to said constraint condition.

53. The data reproducing method according to claim 52 wherein said second interleaving step interleaves data encoded in said modulation encoding step in terms of a modulation encoding block of said trellis as a unit;

said first deinterleaving step interleaves the input data in terms of the modulation encoding block of said trellis as a unit; and wherein said third interleaving step interleaves data given as a difference between data decoded in said modulation decoding step and data re-arrayed in said first deinterleaving step in terms of the modulation encoding block of said trellis as a unit.

54. The data reproducing method according to claim 39 wherein said error correction decoding step is fed with a soft input signal and soft-decodes an error correction code of the soft input signal.

55. The data reproducing method according to claim 39 wherein said first interleaving step interleaves data encoded by said error correction encoding step on the bit basis;

said second deinterleaving step interleaves the input data on the bit basis; and wherein said fourth interleaving step interleaves data given as a difference between data decoded in said error correction decoding step and data re-arrayed in said second deinterleaving step on the bit basis.

56. The data reproducing method according to claim 39 wherein said recording medium has data recorded thereon in a magnetic, optical or magneto-optical system.

57. A data recording and reproducing apparatus for recording and reproducing data for a recording medium, said apparatus comprising:

as a recording system for recording data on said recording medium, error correction encoding means for error correction encoding input data;

first interleaving means for interleaving the data supplied from said error correction encoding means for re-arraying the sequence thereof;

modulation encoding means for applying predetermined modulation encoding on the data supplied from said first interleaving means; and second interleaving means for interleaving the data supplied from said modulation encoding means for re-arraying the sequence thereof; said apparatus also comprising:

as a reproducing system for reproducing data recorded on said recording medium, first deinterleaving means for interleaving input data for re-arraying the sequence thereof, in order to restore a bit sequence of data re-arrayed by said second interleaving means to a bit sequence of data encoded by said modulation encoding means;

modulation decoding means for modulation decoding data supplied from said first deinterleaving means;

third interleaving means for interleaving data given as a difference between data output from said modulation decoding means and data output from said first deinterleaving means, based on the same interleaving position information as that for said second interleaving means;

second deinterleaving means for interleaving the input data for re-arraying the sequence thereof, in order to restore a bit sequence of data re-arrayed by said first interleaving means to a bit sequence of data encoded by said error correction encoding means;

error correction decoding means for decoding the error correction code of data supplied from said second deinterleaving means; and fourth interleaving means for interleaving data given by a difference between data output from said error correction decoding means and data output from said second deinterleaving means for re-arraying the sequence thereof based on the same interleaving position information as that for said first interleaving means.

58. The data recording and reproducing apparatus according to claim 57 wherein said recording system includes precode means for filtering data supplied from said second interleaving means such as to compensate for channel characteristics thereof, and said recording system includes channel decoding means for decoding channel response.

59. The data recording and reproducing apparatus according to claim 58 wherein said channel decoding means is fed with a soft input signal and performs soft output decoding.

60. The data recording and reproducing apparatus according to claim 59 wherein said first deinterleaving means interleaves data given by a difference between data decoded by said channel decoding means and data re-arrayed by said third interleaving means for re-arraying the sequence of the difference data;

said second deinterleaving means interleaving data given as a difference between data decoded by said modulation decoding means and data re-arrayed by said fourth interleaving means for re-arraying the sequence of the difference data;

iterative decoding being made between said error correction decoding means, modulation decoding means and said channel decoding means.

61. The data recording and reproducing apparatus according to claim 58 wherein said channel decoding means is fed with a soft input signal and performs soft output decoding based on a trellis corresponding to channel response.

62. The data recording and reproducing apparatus according to claim 57 wherein said modulation decoding means is fed with a soft input signal and issues a soft output signal.

63. The data recording and reproducing apparatus according to claim 62 wherein said modulation decoding means performs soft output decoding based on the BCJR or SOVA algorithm.

64. The data recording and reproducing apparatus according to claim 57 wherein said modulation encoding means encodes data supplied from said first interleaving means in accordance with a constraint condition; and wherein
    said modulation decoding means performs decoding in accordance with said constraint condition.

65. The data recording and reproducing apparatus according to claim 64 wherein said second interleaving means interleaves the data encoded by said modulation encoding means such as to satisfy said constraint condition.

66. The data recording and reproducing apparatus according to claim 64 wherein said modulation encoding means encodes the data supplied from said first interleaving means by block modulation.

67. The data recording and reproducing apparatus according to claim 66 wherein said modulation decoding means includes likelihood calculating means for calculating a likelihood value corresponding to each output codeword output from said modulation encoding means, and
    wherein said modulation decoding means finds the posterior probability information as a soft decision value for an input bit fed to said modulation encoding means and an output bit issuing from said modulation encoding means based on the likelihood value.

68. The data recording and reproducing apparatus according to claim 66 wherein said modulation decoding means performs decoding based on a trellis corresponding to said constraint condition.

69. The data recording and reproducing apparatus according to claim 66 wherein said second interleaving means interleaves data encoded by block modulation by said modulation encoding means in terms of a modulation encoding block as a unit;
    said first deinterleaving means interleaves the input data in terms of said modulation encoding block as a unit for re-arraying the sequence thereof; and
    wherein said third interleaving means interleaves data given as a difference between data output from said modulation decoding means and data output from said first deinterleaving means for re-arraying the sequence of the difference data in terms of the modulation encoding block as a unit.

70. The data recording and reproducing apparatus according to claim 64 wherein said modulation encoding means encodes data supplied from said first interleaving means in accordance with a trellis corresponding to said constraint condition;
    said modulation decoding means performing decoding based on said trellis corresponding to said constraint condition.

71. The data recording and reproducing apparatus according to claim 70 wherein said second interleaving means interleaves data encoded by said modulation encoding means in terms of a modulation encoding block of said trellis as a unit;
    said first deinterleaving means interleaves the input data in terms of the modulation encoding block of said trellis as a unit; and
    wherein said third interleaving means interleaves data given as a difference between data output from said modulation decoding means and data output from said first deinterleaving means in terms of the modulation encoding block of said trellis as a unit.

72. The data recording and reproducing apparatus according to claim 57 wherein said error correction decoding means is fed with a soft input signal and soft-decodes an error correction code of the input soft input signal.

73. The data recording and reproducing apparatus according to claim 57 wherein said first interleaving means interleaves data encoded by said error correction encoding means on the bit basis;
said second deinterleaving means interleaves the input data on the bit basis; and
wherein said fourth interleaving means interleaves data given as a difference between data output from said error correction decoding means and data output from said second deinterleaving means on the bit basis.

74. The data recording and reproducing apparatus according to claim 57 wherein said recording medium has data recorded thereon in a magnetic, optical or magneto-optical system.

75. A data recording and reproducing method for recording and reproducing data for a recording medium, said method comprising the steps of:
error correction encoding input data;
first interleaving the data supplied from said error correction encoding step for re-arraying the sequence thereof;
modulation encoding to the data supplied from said first interleaving step; and
second interleaving the data supplied from said modulation encoding step for re-arraying the sequence thereof;
first deinterleaving reproduced data for re-arraying the sequence thereof, in order to restore a bit sequence of data re-arrayed by said second interleaving step to a bit sequence of data encoded by said modulation encoding step;
modulation decoding data supplied from said first interleaving step;
third interleaving data given as a difference between data output from said modulation decoding step and data output from said first deinterleaving step, based on the same interleaving position information as that for said second interleaving step;
second deinterleaving the input data for re-arraying the sequence thereof, in order to restore a bit sequence of data re-arrayed by said first interleaving step to a bit sequence of data encoded by said error correction encoding step;
decoding the error correction code of data supplied from said second deinterleaving step; and
fourth interleaving data given by a difference between data output from said error correction decoding step and data output from said second deinterleaving step, for re-arraying the sequence thereof based on the same interleaving position information as that for said first interleaving step.

76. The data recording and reproducing method according to claim 75, further comprising filtering data supplied from said second interleaving step such as to compensate for channel characteristics thereof, and a channel decoding step of decoding channel response.

77. The data recording and reproducing method according to claim 76 wherein said step of decoding channel response is fed with a soft input signal and performs soft output decoding.

78. The data recording and reproducing method according to claim 77 wherein said first deinterleaving step interleaves data given by a difference between data decoded by said channel decoding step and data re-arrayed by said third interleaving step for re-arraying the sequence of the difference data;
said second deinterleaving step interleaves data given as a difference between data decoded by said modulation decoding step and data re-arrayed by said fourth interleaving step for re-arraying the sequence of the difference data;
iterative decoding being made between said error correction decoding step, modulation decoding step and said step of decoding channel response.

79. The data recording and reproducing method according to claim 76 wherein said step of decoding channel response is fed with a soft input signal and performs soft output decoding based on a trellis corresponding to channel response.

80. The data recording and reproducing method according to claim 75 wherein said modulation decoding step is fed with a soft input signal and issues a soft output signal.

81. The data recording and reproducing method according to claim 80 wherein said modulation decoding step performs soft output decoding based on the BCJR or SOVA algorithm.

82. The data recording and reproducing method according to claim 75 wherein said modulation encoding step encodes data supplied from said first interleaving step in accordance with a constraint condition; and wherein said modulation decoding step performs decoding in accordance with said constraint condition.

83. The data recording and reproducing method according to claim 82 wherein said second interleaving step interleaves the data encoded by said modulation encoding step such as to satisfy said constraint condition.

84. The data recording and reproducing method according to claim 82 wherein said modulation encoding step encodes the data supplied from said first interleaving step by block modulation.

85. The data recording and reproducing method according to claim 84 wherein said modulation decoding step includes a likelihood calculating step of calculating a likelihood value corresponding to each output codeword issuing from said modulation encoding step; and
wherein said modulation decoding step finds the posterior probability information as a soft decision value for an input bit fed to said modulation encoding step and an output bit issuing from said modulation encoding step based on the likelihood value.

86. The data recording and reproducing method according to claim 84 wherein said modulation decoding step performs decoding based on a trellis corresponding to said constraint condition.

87. The data recording and reproducing method according to claim 84 wherein said second interleaving step interleaves data encoded by block modulation in said modulation encoding step in terms of a modulation encoding block as a unit;
said first deinterleaving step interleaves the input data in terms of said modulation encoding block as a unit; and
wherein said third interleaving step interleaves data given as a difference between data output from said modulation decoding step and data output from said first deinterleaving step, in terms of a modulation encoding block as a unit, for re-arraying the sequence of the difference data.

88. The data recording and reproducing method according to claim 82 wherein said modulation encoding step encodes data re-arrayed in said first interleaving step in accordance with a trellis corresponding to said constraint condition;
said modulation decoding step performing decoding based on said trellis corresponding to said constraint condition.

89. The data recording and reproducing method according to claim 88 wherein said second interleaving step interleaves data encoded in said modulation encoding step in terms of a modulation encoding block of said trellis as a unit;

said first deinterleaving step interleaves the input data in terms of the modulation encoding block of said trellis as a unit; and wherein said third interleaving step interleaves data given as a difference between data decoded in said modulation decoding step and data re-arrayed in said first deinterleaving step in terms of the modulation encoding block of said trellis as a unit.

90. The data recording and reproducing method according to claim 75 wherein said error correction decoding step is fed with a soft input signal and soft-decodes an error correction code of the input soft input signal.

91. The data recording and reproducing method according to claim 75 wherein said first interleaving step interleaves data encoded by said error correction encoding step on the bit basis;

said second deinterleaving step interleaves the input data on the bit basis; and wherein said fourth interleaving step interleaves data given as a difference between data decoded in said error correction decoding step and data re-arrayed in said second deinterleaving step on the bit basis.

92. The data recording and reproducing method according to claim 75 wherein said recording medium has data recorded thereon in a magnetic, optical or magneto-optical system.

* * * * *